United States Patent
Shigaki et al.

(10) Patent No.: US 10,910,220 B2
(45) Date of Patent: Feb. 2, 2021

(54) PLANARIZATION METHOD FOR A SEMICONDUCTOR SUBSTRATE USING A SILICON-CONTAINING COMPOSITION

(71) Applicant: NISSAN CHEMICAL CORPORATION, Tokyo (JP)

(72) Inventors: Shuhei Shigaki, Toyama (JP); Hiroaki Yaguchi, Toyama (JP); Makoto Nakajima, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 152 days.

(21) Appl. No.: 16/082,189

(22) PCT Filed: Feb. 10, 2017

(86) PCT No.: PCT/JP2017/004918
§ 371 (c)(1),
(2) Date: Sep. 4, 2018

(87) PCT Pub. No.: WO2017/145808
PCT Pub. Date: Aug. 31, 2017

(65) Prior Publication Data
US 2019/0051518 A1 Feb. 14, 2019

(30) Foreign Application Priority Data
Feb. 24, 2016 (JP) ................. 2016-033393

(51) Int. Cl.
*G03F 7/38* (2006.01)
*H01L 21/027* (2006.01)
(Continued)

(52) U.S. Cl.
CPC ........ *H01L 21/0274* (2013.01); *C09D 183/04* (2013.01); *C09D 183/06* (2013.01);
(Continued)

(58) Field of Classification Search
CPC ....... G03F 7/38; C09D 183/04; C09D 183/06; C09D 183/08; C08G 77/12; C08G 77/14;
(Continued)

(56) References Cited

U.S. PATENT DOCUMENTS

| 6,008,540 A | 12/1999 | Lu et al. |
| 2010/0178620 A1 | 7/2010 | Dei et al. |

(Continued)

FOREIGN PATENT DOCUMENTS

| EP | 0 849 240 A1 | 6/1998 |
| EP | 0 860 462 A2 | 8/1998 |

(Continued)

OTHER PUBLICATIONS

Aug. 28, 2018 International Preliminary Report on Patentability issued in International Patent Application No. PCT/JP2017/004918.

(Continued)

*Primary Examiner* — Brittany L Raymond
(74) *Attorney, Agent, or Firm* — Oliff PLC

(57) ABSTRACT

A method for flatly covering a semiconductor substrate using a silicon-containing composition. A method for producing a polysiloxane-coated substrate, including a first step for forming a first polysiloxane coating film by applying a first polysiloxane composition for coating to a stepped substrate and firing the composition thereon and a second step for forming a second film by applying a second polysiloxane composition for coating to the first film and firing the composition thereon. The second film has an Iso-dense bias of 50 nm or less; the first polysiloxane contains a hydrolysis-condensation product of a hydrolyzable silane starting material containing a first hydrolyzable silane having four hydrolyzable groups in each molecule at a ratio of 0-100% by mole in all the silanes; and the second polysiloxane contains silanol groups at a ratio of 30% by mole or (Continued)

less relative to Si atoms, while having a weight average molecular weight of 1,000-50,000.

7 Claims, 5 Drawing Sheets

(51) Int. Cl.
- H01L 21/3105 (2006.01)
- C09D 183/06 (2006.01)
- H01L 21/02 (2006.01)
- H01L 21/033 (2006.01)
- C09D 183/04 (2006.01)
- C09D 183/08 (2006.01)
- C08G 77/14 (2006.01)
- C08G 77/28 (2006.01)
- C08G 77/16 (2006.01)
- C08G 77/12 (2006.01)
- C08G 77/18 (2006.01)
- C08G 77/50 (2006.01)

(52) U.S. Cl.
CPC .............. *C09D 183/08* (2013.01); *G03F 7/38* (2013.01); *H01L 21/02126* (2013.01); *H01L 21/02211* (2013.01); *H01L 21/02282* (2013.01); *H01L 21/0332* (2013.01); *H01L 21/0337* (2013.01); *H01L 21/31055* (2013.01); *C08G 77/12* (2013.01); *C08G 77/14* (2013.01); *C08G 77/16* (2013.01); *C08G 77/18* (2013.01); *C08G 77/28* (2013.01); *C08G 77/50* (2013.01)

(58) Field of Classification Search
CPC ........ C08G 77/16; C08G 77/18; C08G 77/28; C08G 77/50; H01L 21/02126; H01L 21/02211; H01L 21/02282; H01L 21/0274; H01L 21/0332; H01L 21/0337; H01L 21/31055

See application file for complete search history.

(56) References Cited

U.S. PATENT DOCUMENTS

| 2012/0045899 | A1* | 2/2012 | Maruyama | G03F 7/40 |
| | | | | 438/694 |
| 2014/0178808 | A1* | 6/2014 | Shiota | G03F 7/0757 |
| | | | | 430/18 |

FOREIGN PATENT DOCUMENTS

| JP | 01-313942 | * 12/1989 |
| JP | H01-313942 A | 12/1989 |
| JP | H10-229079 A | 8/1998 |
| JP | H10-237307 A | 9/1998 |
| JP | H11-003888 A | 1/1999 |
| JP | 11-311865 | * 11/1999 |
| JP | H11-311865 A | 11/1999 |
| JP | 2001-343757 A | 12/2001 |
| JP | 2010-151923 A | 7/2010 |
| JP | 2011-118373 A | 6/2011 |

OTHER PUBLICATIONS

May 9, 2017 International Search Report issued in International Patent Application No. PCT/JP2017/004918.

* cited by examiner

PLANARIZATION METHOD FOR A SEMICONDUCTOR SUBSTRATE USING A SILICON-CONTAINING COMPOSITION

TECHNICAL FIELD

The present invention relates to a method for coating a semiconductor substrate with flatness using a silicon-containing composition. More particularly, the present invention relates to a method for forming a flat film, which is advantageous in that, especially on a stepped substrate having a difference in height and isolated and dense portions in a resist pattern formed on a substrate to be processed, a flat film can be formed with excellent coverage for the resist pattern.

BACKGROUND ART

A technique for forming very fine patterns on a substrate and processing the substrate by etching it according to the patterns has been widely used in the field of semiconductor fabrication.

As a lithography technique is advancing, patterns used for the lithography are increasingly scaled down. A KrF excimer laser and an ArF excimer laser are used therefor, and further exposure techniques using an electron beam or an EUV light (extreme ultraviolet light) are studied.

The technique for forming a pattern includes a pattern reversal method. A resist pattern is formed on a semiconductor substrate, and the resist pattern is coated with a silicon coating composition. Thus, the resist pattern is filled with the silicon coating composition, followed by baking, to form a coating film. Then, the resultant substrate is etched back by etching the upper portion of the silicon-containing coating film using a fluorine etching gas so that the upper portion of the resist pattern is exposed. The etching gas is changed and the resist pattern is removed using an oxygen etching gas, so that the resist pattern disappears and a silicon pattern derived from the silicon coating film remains, achieving a reversal of pattern.

Using the silicon film having a reverse pattern formed therein as an etching mask, the underlying layer or substrate is etched, so that the reverse pattern is transferred, forming a pattern on the substrate.

Such a method for forming a pattern using a reverse pattern includes an invention utilizing a material using a polysiloxane, which is obtained by cohydrolysis of tetraethoxysilane and a silane having a hydrogen atom, a fluorine atom, a linear or branched alkyl group having 1 to 5 carbon atoms, a cyano group, a cyanoalkyl group, an alkylcarbonyloxy group, an alkenyl group, or an aryl group, in an ether solvent (see Patent Literature 1).

Further, it includes an invention utilizing a material using a hydrogensiloxane (see Patent Literature 2).

CITATION LIST

Patent Literature

Patent Literature 1: JP 2011-118373 A
Patent Literature 2: JP 2010-151923 A

SUMMARY OF INVENTION

Technical Problem

The present invention provides a method for coating a stepped substrate, which is advantageous in that a flat coating can be formed by a specific procedure on a stepped substrate having a difference in height and isolated and dense portions in a resist pattern formed on a substrate to be processed using a specific silicon-containing composition that can advantageously fill the resist pattern.

Solution to Problem

The present invention embraces the followings.

[1] A method for producing a polysiloxane coated substrate comprising the first step of applying a first coating polysiloxane composition comprising a first coating polysiloxane onto a stepped substrate and baking the applied composition to form a first polysiloxane coating film, and the second step of further applying onto the first polysiloxane coating film a second coating polysiloxane composition comprising a second coating polysiloxane different from the first coating polysiloxane and baking the applied composition to form a second polysiloxane coating film, wherein the second polysiloxane coating film has an iso-dense bias of 50 nm or less, wherein the first coating polysiloxane comprises a hydrolysate condensation product of a hydrolyzable silane raw material comprising a first hydrolyzable silane having four hydrolyzable groups per molecule in a proportion of 0 to 100 mol % in all silane, and wherein the second coating polysiloxane comprises a silanol group in a proportion of 30 mol % or less relative to Si atom, and has a weight average molecular weight of 1,000 to 50,000.

[2] The method according to item [1] above, wherein the first coating polysiloxane comprises a hydrolysate condensation product of a hydrolyzable silane raw material comprising a hydrolyzable silane represented by formula (1):

[Chemical formula 1]

$$R^1_a Si(R^2)_{4-a} \quad \text{Formula (1)}$$

wherein $R^1$ represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group and is bonded to a silicon atom through a Si—C bonding, $R^2$ represents an alkoxy group, an acyloxy group, or a halogen group, and a represents an integer of 0 to 2, wherein the hydrolyzable silane raw material comprises 0 to 50 mol % of the hydrolyzable silane represented by formula (1) wherein a is 0, and 50 (exclusive) to 100 mol % of the hydrolyzable silane represented by formula (1) wherein a is 1 or 2.

[3] The method according to item [1] or [2] above, wherein the second coating polysiloxane comprises a hydrolysate condensation product of a hydrolyzable silane raw material comprising a hydrolyzable silane represented by formula (1):

[Chemical formula 2]

$$R^1_a Si(R^2)_{4-a} \quad \text{Formula (1)}$$

wherein $R^1$ represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group and is bonded to a silicon atom through a Si—C bonding, $R^2$ represents an alkoxy group, an acyloxy group, or a halogen group, and a represents 1.

[4] The method according to item [3] above, wherein the second coating polysiloxane comprises a hydrolysate condensation product of a hydrolyzable silane raw material comprising 100 to 50 mol % of the hydrolyzable silane represented by formula (1) above wherein a is 1, and 0 to 50 mol % of the hydrolyzable silane represented by formula (1) above wherein a is 2.

[5] The method according to item [1] above, wherein the second coating polysiloxane is a modified polysiloxane having a capped silanol group of a polysiloxane which is a hydrolyzed and condensed product of a hydrolyzable silane raw material, the modified polysiloxane comprising a silanol group in a proportion of 30 mol % or less relative to Si atom, wherein the modified polysiloxane comprises a hydrolysate condensation product of a hydrolyzable silane raw material represented by formula (1):

[Chemical formula 3]

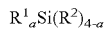   Formula (1)

wherein $R^1$ is bonded to a silicon atom through a Si—C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, and $R^2$ represents an alkoxy group, an acyloxy group, or a halogen group, wherein the hydrolyzable silane raw material comprises 0 to 100 mol % of a hydrolyzable silane wherein a is 0, and 0 to 100 mol % of a hydrolyzable silane wherein a is 1.

[6] A method for planarizing a polysiloxane film on a stepped substrate, comprising the first step of applying a first coating polysiloxane composition comprising a first coating polysiloxane onto a stepped substrate and baking the applied composition to form a first polysiloxane coating film, and the second step of applying onto the first polysiloxane coating film a second coating polysiloxane composition comorising a second coating polysiloxane different from the first coating polysiloxane and baking the applied composition to form a second polysiloxane coating film.

[7] A method for producing a semiconductor device, comprising:

the first step of applying a first coating polysiloxane composition comprising a first coating polysiloxane onto an organic pattern substrate and baking the applied composition to form a first polysiloxane coating film, the second step of further applying onto the first polysiloxane coating film a second coating polysiloxane composition comprising a second coating polysiloxane different from the first coating polysiloxane and baking the applied composition to form a second polysiloxane coating film, etching back a polysiloxane coated substrate produced by the first and second steps so that the organic pattern is exposed, and removing the organic pattern by etching so that a reverse pattern remains.

Advantageous Effects of Invention

The coating polysiloxane composition in the present invention coats a patterned organic underlayer film formed on a substrate to be processed without being mixed with the patterned organic underlayer film, so that the pattern of the organic underlayer film can be advantageously filled with the composition. In the present invention, by employing a specific material having a low silanol content and a low viscosity, various fine and coarse patterns can be filled with a film of the material with flatness without a difference in thickness of the film. The coating polysiloxane composition is cured to form a polysiloxane composition film, and the film is etched back later by etching (gas etching), so that a flat surface can be formed. Further, because the organic underlayer film can be removed by ashing, a reverse pattern of the pattern in the organic underlayer film can be formed in the polysiloxane composition film formed from the coating polysiloxane composition that had filled the pattern of the organic underlayer film. The substrate to be processed can be processed using the resultant reverse pattern.

As a conventional technique, there has been a method in which a photoresist pattern is filled with a polysiloxane composition, and then etched using an oxygen etching gas so as to form a reverse pattern of the photoresist in the polysiloxane. However, this conventional method has a problem in that, particularly on a substrate having a photoresist pattern having isolated and dense portions, the film formed from the polysiloxane composition filling the photoresist pattern has an increased difference in thickness, causing the iso-dense bias to be larger.

Furthermore, this method is disadvantageous in that the thickness of the resist is so small that a reverse pattern having a high aspect ratio cannot be obtained. By contrast, in the present invention, a reversal of pattern can be made by using a stepped substrate having a large aspect ratio, as compared to that of a photoresist pattern on a substrate to be processed, so that a reverse pattern having a high aspect ratio can be obtained. In the present invention, it is possible to fill a pattern of an organic underlayer film having a large aspect ratio with a coating composition, and therefore coating with a specific polysiloxane composition is effective.

Further, in a method as a conventional technique in which a photoresist pattern is filled with a polysiloxane composition, an organic film is present as an underlayer, and therefore a treatment, such as ashing, is difficult and gas etching is generally performed. By contrast, in the present invention, with respect to the pattern of the organic underlayer film immediately on a substrate to be processed or on an oxide film, a reversal of the pattern can be made using the polysiloxane composition, and therefore the pattern reversal can be easily achieved by an ashing treatment after filling the pattern with the polysiloxane composition and then curing the composition.

Particularly, in the present invention, by employing a double application process, complete planarization for the stepped surface can be made, making it possible to realize very flat planarization property of the coating film. As a result, a satisfactory film remains and a pattern reversal processing can be performed in that state. Further, by employing a material having a high etching resistance in the first application, not only can the planarization property of the coating film be improved, but also a high etching resistance can be achieved. Thus, an advantage is obtained in that the pattern reversal processing can be made in the state in which a film having a high etching resistance remains. The term "planarization" means that, with respect to the coating film applied to a resist pattern, there is a small difference in the thickness of the applied coating film present above both a portion of the resist in which the pattern is present (line portion) and a portion of the resist in which the pattern is not present (space portion).

DESCRIPTION OF EMBODIMENTS

1. Planarization Method for a Semiconductor Substrate

Hereinbelow, an example of a method for producing a semiconductor device comprising the planarization method for a semiconductor substrate of the present invention will be described. Further, the method is diagrammatically shown in FIG. 14.

The stepped substrate in the present invention, for example, includes wafers for a semiconductor device or a MEMS device. For example, it includes (1) a silicon wafer having a step formed by a Bosch process or an alkaline aqueous solution and having the step on one of the major surfaces, (2) an SOI (Silicon on Insulator) wafer having a silicon oxide film present between a silicon wafer and another silicon wafer and having a step on one of the major surfaces, (3) a gallium-arsenic substrate having a step form on one of the major surfaces, and (4) a silicon wafer having a metal or insulating film formed thereon and having a step form on one of the major surfaces.

The method for producing a semiconductor device comprising the planarization method for a semiconductor substrate according to the present invention is a method for producing a semiconductor device, which usually comprises the steps of: (1) applying a resist onto a substrate, (2) subjecting the resist to exposure and development, (3) applying a coating polysiloxane composition to the resist pattern during or after the development, and (4) etching the resist pattern to remove it so that a reverse pattern remains, wherein the step (3) comprises the first step of applying a first coating polysiloxane composition containing a first coating polysiloxane onto a stepped substrate and baking the applied composition to form a first polysiloxane coating film, and the second step of applying onto the first polysiloxane coating film a second coating polysiloxane composition containing a second coating polysiloxane different from the first coating polysiloxane and baking the applied composition to form a second polysiloxane coating film.

The above-mentioned composition is applied onto a resist pattern having a layout having isolated and dense portions so as to cover the pattern. The resist pattern before coated with the composition may be formed by nanoimprinting.

Figure 14:
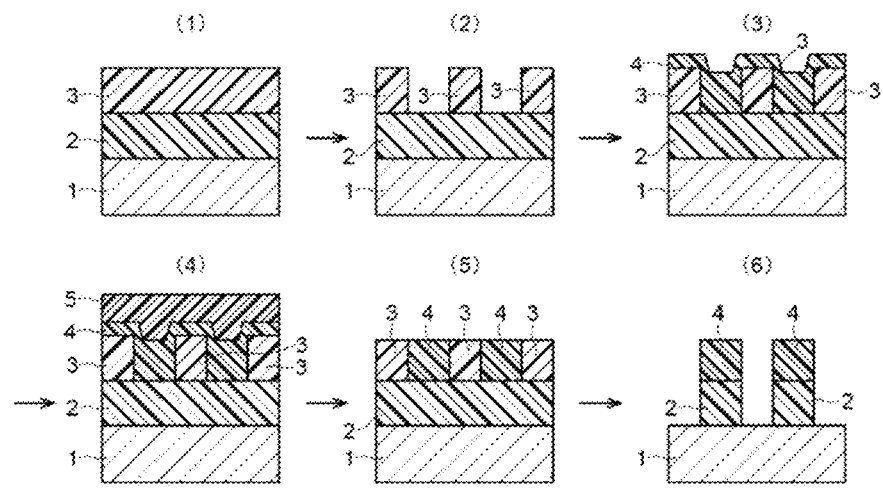
FIG. 14 Explanatory views illustrating one example of an application method using the coating polysiloxane composition in the present invention.

[Step (1) (FIG. 14(1))]

With respect to the photoresist used in step (1), there is no particular limitation as long as it is sensitive to a light used in the exposure. Any of a negative photoresist and a positive photoresist can be used. There are, for example, a positive photoresist comprising a novolak resin and 1,2-naphthoquinonediazidosulfonate; a chemical amplification photoresist comprising a binder having a group that is decomposable by an acid to increase the alkali solubility, and a photo-acid generator; a chemical amplification photoresist comprising a low-molecular weight compound that is decomposable by an acid to increase the alkali solubility of the photoresist, an alkali-soluble binder, and a photo-acid generator; and a chemical amplification photoresist comprising a binder having a group that is decomposable by an acid to increase the alkali solubility, a low-molecular weight compound that is decomposable by an acid to increase the alkali solubility of the photoresist, and a photo-acid generator. For example, the photoresist includes trade name: APEX-E, manufactured by Shipley Company, Inc.; trade name: PAR710, manufactured by Sumitomo Chemical Co., Ltd.; and trade name: SEPR430, manufactured by Shin-Etsu Chemical Co., Ltd. Further, it includes fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Any of a negative electron beam resist and a positive electron beam resist can be used. Such a resist includes, for example, a chemical amplification resist comprising an acid generator and a binder having a group that is decomposable by an acid to change the alkali solubility; a chemical amplification resist comprising an alkali-soluble binder, an acid generator, and a low-molecular weight compound that is decomposable by an acid to change the alkali solubility of the resist; a chemical amplification resist comprising an acid generator, a binder having a group that is decomposable by an acid to change the alkali solubility, and a low-molecular weight compound that is decomposable by an acid to change the alkali solubility of the resist; a non-chemical amplification resist comprising a binder having a group that is decomposable by an electron beam to change the alkali solubility; and a non-chemical amplification resist comprising a binder having a site that is broken by an electron beam to change the alkali solubility. When these electron beam resists are used, a resist pattern can be formed in the same manner as in the case using a photoresist using an electron beam as an irradiation source.

After applied, the resist solution is baked at a baking temperature of 70 to 150° C. for a baking time of 0.5 to 5 minutes, and the resultant resist film has a thickness within the range of from 10 to 1,000 nm. The resist solution or developer, or the below-mentioned coating materials can be applied by, for example, spin coating, a dipping method, or a spraying method, but especially preferred is a spin coating method. The resist is exposed to light through a predetermined mask. In the exposure, for example, a KrF excimer laser (wavelength: 248 nm), an ArF excimer laser (wavelength: 193 nm), an EUV light (wavelength: 13.5 nm), or an electron beam can be used. After the exposure, if necessary, a post exposure bake (PEB) can be performed. The post exposure bake is performed under conditions appropriately selected from those at a baking temperature of 70 to 150° C. for a baking time of 0.3 to 10 minutes.

Before step (1), the method may comprise step (1-1) of forming a resist underlayer film on a substrate. The resist underlayer film has an anti-reflection or organic hard mask function. Step (1) of forming a resist may comprise step (1-1) in which a resist underlayer film is formed on a semiconductor substrate and a resist is formed thereon. Further, in step (1-1), a resist underlayer film is formed on a semiconductor substrate, a silicon hard mask is formed thereon, and a resist can be formed on the mask. The resist underlayer film used in step (1-1) prevents irregular reflection during the exposure for the upper layer resist, and is used for the purpose of improving the adhesion to the resist, and, for example, an acrylic resin or a novolak resin can be used. As the resist underlayer film, a film having a thickness of 1 to 1,000 nm can be formed on the semiconductor substrate. Further, the resist underlayer film used in step (1-1) is a hard mask using an organic resin, and a material having a high carbon content and a low hydrogen content is used therefor. Examples of such materials include a polyvinyl naphthalene resin, a carbazole novolak resin, a phenolic novolak resin, and a naphthol novolak resin. From these resins, a film having a thickness of 5 to 1,000 nm can be formed on the semiconductor substrate. As the silicon hard mask used in step (1-1), a polysiloxane obtained by hydrolyzing a hydrolyzable silane can be used. For example, such a polysiloxane includes polysiloxanes obtained by hydrolyzing tetraethoxysilane, methyltrimethoxysilane, or phenyltriethoxysilane. From these polysiloxanes, a film having a thickness of 5 to 200 nm can be formed on the resist underlayer film.

[Step (2) (FIG. 14(2))]

In step (2), exposure through a predetermined mask is conducted. In the exposure, for example, a KrF excimer laser (wavelength: 248 nm), an ArF excimer laser (wavelength: 193 nm), or an EUV light (wavelength: 13.5 nm) can be used. After the exposure, if necessary, a post exposure bake can be performed. The post exposure bake is performed under conditions appropriately selected from those at a baking temperature of 70 to 150° C. for a baking time of 0.3 to 10 minutes. Then, development using a developer is conducted. Thus, for example, when a positive photoresist is used, the exposed portion of the photoresist is removed, so that a pattern of the photoresist is formed.

Examples of developers include alkaline aqueous solutions, e.g., an aqueous solution of an alkali metal hydroxide, such as potassium hydroxide or sodium hydroxide, an aqueous solution of a quaternary ammonium hydroxide, such as tetramethylammonium hydroxide, tetraethylammonium hydroxide, or choline, and an aqueous solution of an amine, such as ethanolamine, propylamine, or ethylenediamine. Further, for example, a surfactant can be added to the developer. Conditions for development are appropriately selected from those at a temperature of 5 to 50° C. for a time of 10 to 600 seconds. Further, in the present invention, an organic solvent can be used as a developer. After the exposure, development using a developer (solvent) is performed. Thus, for example, when a positive photoresist is used, the unexposed portion of the photoresist is removed, so that a pattern of the photoresist is formed.

Examples of developers include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate. Further, for example, a surfactant can be added to the developer. Conditions for development are appropriately selected from those at a temperature of 5 to 50° C. for a time of 10 to 600 seconds.

[Step (3) (FIGS. 14(3) and 14(4))]

Figure 15:
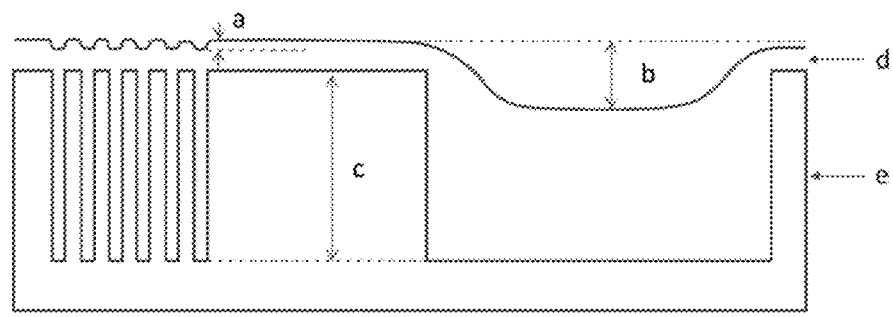
FIG. 15 An explanatory view illustrating an iso-dense bias.

In step (3), a first coating polysiloxane composition containing a first coating polysiloxane is applied to the resist during or after the development and baked to form a first polysiloxane coating film, and a second coating polysiloxane composition containing a second coating polysiloxane different from the first coating polysiloxane is applied onto the first polysiloxane coating film and baked to form a second polysiloxane coating film, to form a polysiloxane composition film having a pattern of the resist filled with the composition. The applied coating polysiloxane composition is baked at a baking temperature of 50 to 180° C. for 0.5 to 5 minutes. The second polysiloxane coating film has an iso-dense bias of 50 nm or less. The iso-dense bias of the second polysiloxane coating film refers to the difference between the smallest thickness and the largest thickness of the film, in which the thickness means the length from the interface of the stepped substrate on the side in contact with the film to the interface of the second polysiloxane coating film on the side in contact with the air. Specifically, the length of character b shown in FIG. 15 corresponds to the iso-dense bias. In the figure, character a designates a depth of the depression in the polysiloxane coating film at the center of the dense space portion, character b designates a depth of the depression in the polysiloxane coating film at the center of the open space portion, character c designates a depth of the original space in the stepped substrate used, character d designates a polysiloxane coating film, and character e designates a stepped substrate. The stepped substrate can be an organic pattern (e.g., a photoresist pattern, a resist underlayer film (of an application type or a deposition type) pattern which functions as an etching mask for the underlying semiconductor substrate, or a pattern formed by nanoimprinting) substrate.

In the present invention, after step (3), the method may comprise step (3-1) of etching back the surface of the coating film so that the surface of the resist pattern (for example, an organic pattern) is exposed. By performing this step, in the subsequent step (4), the surface of the resist pattern is consistent with the surface of the coating composition, and, due to the difference of gas etching rate of the resist pattern and that of the coating composition, only the resist component is removed, so that the component of the coating composition remains, to achieve a reversal of pattern. In the etchback, the resist pattern is bared using a gas (for example, a fluorine etching gas) which can remove the coating composition.

[Step (4) (FIGS. 14(5) and 14(6))]

In step (4), the resist pattern is removed by etching so that a reverse pattern remains. In step (4), dry etching is conducted using a gas, such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, or chlorine trifluoride. Dry etching is especially preferably conducted using an oxygen etching gas.

Thus, the original resist pattern is removed, so that a reverse pattern is formed from the polymer for forming a reverse pattern (polysiloxane obtained by hydrolyzing and condensing the hydrolyzable silane) contained in the coating composition.

2. First Coating Polysiloxane Composition Containing a First Coating Polysiloxane An explanation is made below on the first coating polysiloxane composition containing a first coating polysiloxane used in the first step of the method for producing a polysiloxane coated substrate of the present invention.

In the above-mentioned step (3), the first coating polysiloxane composition containing a first coating polysiloxane is applied onto the patterned organic underlayer film. In this instance, a part of the silicon hard mask may be left remained on the upper surface of the organic underlayer film. The reason for this is that the first coating polysiloxane composition will be etched back later so as to bare the upper surface of the organic underlayer film, and thus both the coating polysiloxane and the silicon hard mask will be removed by etchback at the same time.

The first coating polysiloxane generally comprises a hydrolysate condensation product of a hydrolyzable silane raw material. The hydrolyzable silane raw material may include one or two or more species of silanes. The hydrolyzable silane comprises a hydrolysate condensation product of a hydrolyzable silane raw material comprising a first hydrolyzable silane having four hydrolyzable groups per molecule in a proportion of 0 to 100 mol % in all silane, more preferably comprises a hydrolysate condensation product of a hydrolyzable silane raw material comprising a first hydrolyzable silane having four hydrolyzable groups per molecule in a proportion of 0 to 50 mol % in all silane, and a first hydrolyzable silane having three or two hydrolyzable groups per molecule in a proportion of 50 (exclusive) to 100 mol % in all silane.

It is preferred that the hydrolyzable silane is represented by the following formula (1):

[Chemical formula 4]

$$R^1_a Si(R^2)_{4-a} \qquad \text{Formula (1)}$$

wherein $R^1$ is bonded to the silicon atom through a Si—C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, $R^2$ represents an alkoxy group, an acyloxy group, or a halogen group, and a represents an integer of 0 to 2.

The hydrolyzable silane raw material more preferably contains the hydrolyzable silane of formula (1) wherein a is 0 in a proportion of 0 to 50 mol % and the hydrolyzable silane of formula (1) wherein a is 1 or 2 in a proportion of 50 (exclusive) to 100 mol % in all silane.

The first coating polysiloxane composition in the present invention preferably contains a solvent and a hydrolysate condensation product of the hydrolyzable silane raw material represented by formula (1) above. Further, the first coating polysiloxane composition may contain, as an optional component, for example, an acid, water, an alcohol, a curing catalyst, an acid generator, another organic polymer, a light absorbing compound, and a surfactant. The solids content of the first coating polysiloxane composition in the present invention ranges, for example, 0.1 to 50% by mass, 0.1 to 30% by mass, 0.1 to 25% by mass, 0.5 to 20.0% by mass, or 1.0 to 10.0% by mass. The solids content refers to all components of the first coating polysiloxane composition except for the solvent component. The proportion of the hydrolyzable silane, hydrolysate thereof, and hydrolysate condensation product thereof in the solids is 20% by mass or more, for example, 50 to 100% by mass, 60 to 99% by mass, or 70 to 99% by mass. The concentration of the hydrolyzable silane, hydrolysate thereof, and hydrolysate condensation product thereof (polysiloxane) in the composition is 0.5 to 20.0% by mass.

In the present invention, the composition is a coating composition used after the exposure of the resist to light, and therefore the resist is subjected to exposure through a mask and the resist during or after the development is filled with the composition.

The hydrolyzable silane, hydrolysate thereof, and hydrolysate condensation product thereof have a resin component different from the resist.

Thus, in the subsequent dry etching step, by appropriately selecting the type of gas, the resist is selectively removed by dry etching, so that a new pattern is formed from the hydrolysate condensation product (polysiloxane) filling the resist.

The hydrolyzable silane, hydrolysate thereof, and hydrolysate condensation product thereof may also be used in the form of a mixture thereof. The hydrolyzable silane is hydrolyzed, and a condensation product obtained by condensing the resultant hydrolysate may be used. There can also be used a mixture of a silane compound or the hydrolysate condensation product having mixed thereinto a partial hydrolysate, which has not been completely hydrolyzed when obtaining the hydrolysate condensation product. The condensation product is a polymer having a polysiloxane structure.

Typical examples of the above-mentioned alkyl groups include linear or branched alkyl groups having 1 to 10 carbon atoms, such as a methyl group, an ethyl group, a n-propyl group, an i-propyl group, a n-butyl group, an i-butyl group, a s-butyl group, a t-butyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a n-hexyl, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

Further, a cyclic alkyl group can be used, and examples of such groups include cyclic alkyl groups having 1 to 10 carbon atoms, such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Typical examples of the above-mentioned alkenyl groups include alkenyl groups having 2 to 10 carbon atoms, such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Typical examples of the above-mentioned aryl groups include aryl groups having 6 to 20 carbon atoms, such as a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Typical examples of the above-mentioned organic groups having an epoxy group include glycidoxymethyl, glycidoxyethyl, glycidoxypropyl, glycidoxybutyl, and epoxycyclohexyl. Typical examples of the above-mentioned organic groups having an acryloyl group include acryloylmethyl, acryloylethyl, and acryloylpropyl. Typical examples of the above-mentioned organic groups having a methacryloyl group include methacryloylmethyl, methacryloylethyl, and methacryloylpropyl. Typical examples of the above-mentioned organic groups having a mercapto group include ethylmercapto, butylmercapto, hexylmercapto, and octylmercapto. Typical examples of the above-mentioned organic groups having a cyano group include cyanoethyl and cyanopropyl.

Typical examples of the above-mentioned alkoxy groups include alkoxy groups having a linear, branched, or cyclic alkyl portion having 1 to 20 carbon atoms, such as a methoxy group, an ethoxy group, a n-propoxy group, an i-propoxy group, a n-butoxy group, an i-butoxy group, a s-butoxy group, a t-butoxy group, a n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group, and cyclic alkoxy groups, such as a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-i-propyl-cyclopropoxy group, a 2-i-propyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Typical examples of the above-mentioned acyloxy groups include the acyloxy groups having 2 to 20 carbon atoms, such as a methylcarbonyloxy group, an ethylcarbonyloxy group, a n-propylcarbonyloxy group, an i-propylcarbonyloxy group, a n-butylcarbonyloxy group, an i-butylcarbonyloxy group, a s-butylcarbonyloxy group, a t-butylcarbonyloxy group, a n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, a n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Typical examples of the above-mentioned halogen groups include fluorine, chlorine, bromine, and iodine. The above-mentioned examples of groups can be applied to the portions of alkyl group, aryl group, alkoxy group, and halogen group in the haloalkyl group, haloaryl group, and alkoxyaryl group.

In formula (1), $R^1$ is preferably a methyl group or a phenyl group optionally substituted with a halogen group or an alkoxy group.

Further, in the present invention, a coating polysiloxane composition containing a hydrolysate condensation product of a hydrolyzable silane raw material, which contains the hydrolyzable silane represented by formula (1) (wherein a is 1 or 2) in a proportion of 100 mol % in all silane, and a crosslinking compound having 2 to 6 methoxymethyl groups per molecule may be used. Examples of the crosslinking compounds having 2 to 6 methoxymethyl groups per molecule include melamine and substituted urea crosslinking compounds and polymers thereof. Preferred are crosslinking agents having a crosslinking formation substituent, and examples include compounds, such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Further, condensation products of these compounds may be used. The amount of the crosslinking agent added varies depending on, for example, the coating solvent used, the substrate used, the required solution viscosity, or the required form of film, but ranges 0.001 to 80% by mass, preferably 0.01 to 50% by mass, further preferably 0.05 to 40% by mass, based on the mass of all solids.

In the present invention, as a catalyst for accelerating the above-mentioned crosslinking reaction, an acid compound, such as p-toluenesulfonic acid, trifluoromethanesulfonic acid, pyridinium p-toluenesulfonate, salicylic acid, sulfosalicylic acid, citric acid, benzoic acid, hydroxybenzoic acid, or naphthalenecarboxylic acid, or/and a thermal acid generator, such as 2,4,4,6-tetrabromocyclohexadienone, benzoin tosylate, 2-nitrobenzyl tosylate, or another organic sulfonic acid alkyl ester, may be incorporated. The amount of the catalyst incorporated ranges 0.0001 to 20% by mass, preferably 0.0005 to 10% by mass, preferably 0.01 to 3% by mass, based on the mass of all solids.

Specific examples of the hydrolysate condensation products (polysiloxanes) used in the present invention are shown below.

[Chemical formula 5]

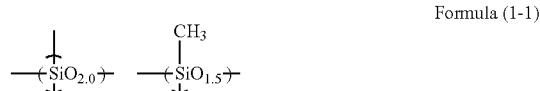

Formula (1-1)

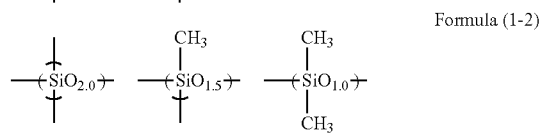

Formula (1-2)

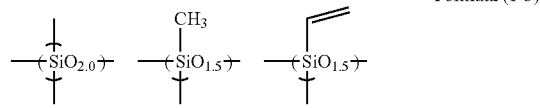

Formula (1-3)

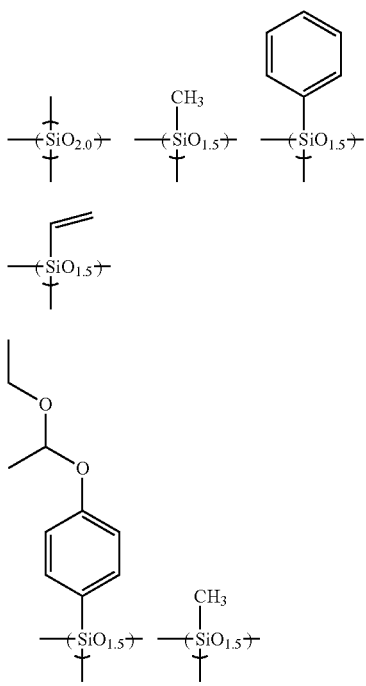

Formula (1-4)

Formula (1-5)

Formula (1-6)

With respect to the hydrolysate condensation product (polyorganosiloxane) of the hydrolyzable silane raw material, a condensation product having a weight average molecular weight of 1,000 to 1,000,000 or 1,000 to 100,000 can be obtained. The molecular weight is a molecular weight as measured by a GPC analysis in which polystyrene is used for molecular weight calibration. Conditions for the GPC measurement can be employed such that, for example, a GPC apparatus (trade name: HLC-8220GPC, manufactured by Tosoh Corp.) and a GPC column (trade name: Shodex KF803L, KF802, KF801, manufactured by Showa Denko K.K.) are used, the column temperature is 40° C., tetrahydrofuran is used as an eluent (elution solvent), the flow rate is 1.0 ml/minute, and polystyrene (manufactured by Showa Denko K.K.) is used as a standard sample.

In hydrolysis of an alkoxysilyl group, an acyloxysilyl group, or a halosilyl group, 0.5 to 100 mol, preferably 1 to 10 mol of water is used per 1 mol of a hydrolyzable group. In hydrolysis, a hydrolysis catalyst may be used, but hydrolysis may be made without using a hydrolysis catalyst. When a hydrolysis catalyst is used, 0.001 to 10 mol, preferably 0.001 to 1 mol of the hydrolysis catalyst may be used per 1 mol of a hydrolyzable group. The reaction temperature for conducting hydrolysis and condensation generally ranges 20 to 110° C. The hydrolysis may be either complete hydrolysis or partial hydrolysis. That is, a hydrolysate or monomers may be left remained in the hydrolysate condensation product.

A catalyst may be used in the hydrolysis and condensation. As a hydrolysis catalyst, an acid or a base may be used. Further, examples of hydrolysis catalysts include metal chelate compounds, organic acids, inorganic acids, organic bases, and inorganic bases.

Examples of metal chelate compounds as a hydrolysis catalyst include titanium chelate compounds, such as triethoxy-mono(acetylacetonato)titanium, tri-n-propoxy-mono(acetylacetonato)titanium, tri-i-propoxy-mono(acetylacetonato)titanium, tri-n-butoxy-mono(acetylacetonato)titanium, tri-sec-butoxy-mono(acetylacetonato)titanium, tri-t-butoxy-mono(acetylacetonato)titanium, diethoxy-bis(acetylacetonato)titanium, di-n-propoxy-bis(acetylacetonato)titanium, di-i-propoxy-bis(acetylacetonato)titanium, di-n-butoxy-bis(acetylacetonato)titanium, di-sec-butoxy-bis(acetylacetonato)titanium, di-t-butoxy-bis(acetylacetonato)titanium, monoethoxy-tris(acetylacetonato)titanium, mono-n-propoxy-tris(acetylacetonato)titanium, mono-i-propoxy-tris(acetylacetonato)titanium, mono-n-butoxy-tris(acetylacetonato)titanium, mono-sec-butoxy-tris(acetylacetonato)titanium, mono-t-butoxy-tris(acetylacetonato)titanium, tetrakis(acetylacetonato)titanium, triethoxy-mono(ethylacetoacetate)titanium, tri-n-propoxy-mono(ethylacetoacetate)titanium, tri-i-propoxy-mono(ethylacetoacetate)titanium, tri-n-butoxy-mono(ethylacetoacetate)titanium, tri-sec-butoxy-mono(ethylacetoacetate)titanium, tri-t-butoxy-mono(ethylacetoacetate)titanium, diethoxy-bis(ethylacetoacetate)titanium, di-n-propoxy-bis(ethylacetoacetate)titanium, di-i-propoxy-bis(ethylacetoacetate)titanium, di-n-butoxy-bis(ethylacetoacetate)titanium, di-sec-butoxy-bis(ethylacetoacetate)titanium, di-t-butoxy-bis(ethylacetoacetate)titanium, monoethoxy-tris(ethylacetoacetate)titanium, mono-n-propoxy-tris(ethylacetoacetate)titanium, mono-i-propoxy-tris(ethylacetoacetate)titanium, mono-n-butoxy-tris(ethylacetoacetate)titanium, mono-sec-butoxy-tris(ethylacetoacetate)titanium, mono-t-butoxy-tris(ethylacetoacetate)titanium, tetrakis(ethylacetoacetate)titanium, mono(acetylacetonato)tris(ethylacetoacetate)titanium, bis(acetylacetonato)bis(ethylacetoacetate)titanium, and tris(acetylacetonato)mono(ethylacetoacetate)titanium; zirconium chelate compounds, such as triethoxy-mono(acetylacetonato)zirconium, tri-n-propoxy-mono(acetylacetonato)zirconium, tri-i-propoxy-mono(acetylacetonato)zirconium, tri-n-butoxy-mono(acetylacetonato)zirconium, tri-sec-butoxy-mono(acetylacetonato)zirconium, tri-t-butoxy-mono(acetylacetonato)zirconium, diethoxy-bis(acetylacetonato)zirconium, di-n-propoxy-bis(acetylacetonato)zirconium, di-i-propoxy-bis(acetylacetonato)zirconium, di-n-butoxy-bis(acetylacetonato)zirconium, di-sec-butoxy-bis(acetylacetonato)zirconium, di-t-butoxy-bis(acetylacetonato)zirconium, monoethoxy-tris(acetylacetonato)zirconium, mono-n-propoxy-tris(acetylacetonato)zirconium, mono-i-propoxy-tris(acetylacetonato)zirconium, mono-n-butoxy-tris(acetylacetonato)zirconium, mono-sec-butoxy-tris(acetylacetonato)zirconium, mono-t-butoxy-tris(acetylacetonato)zirconium, tetrakis(acetylacetonato)zirconium, triethoxy-mono(ethylacetoacetate)zirconium, tri-n-propoxy-mono(ethylacetoacetate)zirconium, tri-i-propoxy-mono(ethylacetoacetate)zirconium, tri-n-butoxy-mono(ethylacetoacetate)zirconium, tri-sec-butoxy-mono(ethylacetoacetate)zirconium, tri-t-butoxy-mono(ethylacetoacetate)zirconium, diethoxy-bis(ethylacetoacetate)zirconium, di-n-propoxy-bis(ethylacetoacetate)zirconium, di-i-propoxy-bis(ethylacetoacetate)zirconium, di-n-butoxy-bis(ethylacetoacetate)zirconium, di-sec-butoxy-bis(ethylacetoacetate)zirconium, di-t-butoxy-bis(ethylacetoacetate)zirconium, monoethoxy-tris(ethylacetoacetate)zirconium, mono-n-propoxy-tris(ethylacetoacetate)zirconium, mono-i-propoxy-tris(ethylacetoacetate)zirconium, mono-n-butoxy-tris(ethylacetoacetate)zirconium, mono-sec-butoxy-tris(ethylacetoacetate)zirconium, mono-t-butoxy-tris(ethylacetoacetate)zirconium, tetrakis(ethylacetoacetate)zirconium, mono(acetylacetonato)tris(ethylacetoacetate)

zirconium, bis(acetylacetonato)bis(ethylacetoacetate)zirconium, and tris(acetylacetonato)mono(ethylacetoacetate)zirconium; and aluminum chelate compounds, such as tris(acetylacetonato)aluminum and tris(ethylacetoacetate)aluminum.

Examples of organic acids as a hydrolysis catalyst include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of inorganic acids as a hydrolysis catalyst include hydrochloric acid, nitric acid, sulfuric acid, hydrofluoric acid, and phosphoric acid.

Examples of organic bases as a hydrolysis catalyst include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, and tetramethylammonium hydroxide. Examples of inorganic bases include ammonia, sodium hydroxide, potassium hydroxide, barium hydroxide, and calcium hydroxide. Of these catalysts, preferred are metal chelate compounds, organic acids, and inorganic acids, and these may be used alone or in combination.

Examples of organic solvents used in the hydrolysis include aliphatic hydrocarbon solvents, such as n-pentane, i-pentane, n-hexane, i-hexane, n-heptane, i-heptane, 2,2,4-trimethylpentane, n-octane, i-octane, cyclohexane, and methylcyclohexane; aromatic hydrocarbon solvents, such as benzene, toluene, xylene, ethylbenzene, trimethylbenzene, methylethylbenzene, n-propylbenzene, i-propylbenzene, diethylbenzene, i-butylbenzene, triethylbenzene, di-i-propylbenzene, n-amylnaphthalene, and trimethylbenzene; monoalcohol solvents, such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohol solvents, such as ethylene glycol, propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone solvents, such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone; ether solvents, such as ethyl ether, i-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, propylene glycol monomethyl ether acetate, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents, such as diethyl carbonate, methyl acetate, ethyl acetate, γ-butyrolactone, γ-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents, such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents, such as dimethyl sulfide, diethyl sulfide, thiophene, tetrahydrothiophene, dimethyl sulfoxide, sulfolane, and 1,3-propane sultone. These solvents can be used alone or in combination.

Particularly, preferred are ketone solvents, such as acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylnonanone, cyclohexanone, methylcyclohexanone, 2,4-pentanedione, acetonylacetone, diacetone alcohol, acetophenone, and fenchone, from the viewpoint of the storage stability of the resultant solution.

3. Second Coating Polysiloxane Composition Containing a Second Coating Polysiloxane An explanation is made below on the second coating polysiloxane composition containing a second coating polysiloxane used in the first step of the method for producing a polysiloxane coated substrate of the present invention.

The second coating polysiloxane is different from the first coating polysiloxane.

The second coating polysiloxane contains a silanol group in a proportion of 30 mol % or less relative to Si atom, and has a weight average molecular weight of 1,000 to 50,000. The proportion of the silanol group can be 5 to 30 mol %, or 10 to 30 mol %, or 5 to 20 mol %, or 10 to 20 mol %.

It is preferred that the second coating polysiloxane comprises a hydrolysate condensation product of a hydrolyzable silane raw material represented by the following formula (1):

[Chemical formula 6]

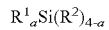    Formula (1)

wherein $R^1$ is bonded to the silicon atom through a Si—C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, $R^2$ represents an alkoxy group, an acyloxy group, or a halogen group, and a represents 1.

The alkyl group, aryl group, haloalkyl group, haloaryl group, alkoxyaryl group, alkenyl group, epoxy group, acryloyl group, methacryloyl group, mercapto group, cyano group, alkoxy group, acyloxy group, halogen group and others are as described above in the item "2. First coating polysiloxane composition containing a first coating polysiloxane".

It is preferred that the second coating polysiloxane comprises a hydrolysate condensation product of a hydrolyzable silane raw material represented by formula (1) above, wherein the hydrolyzable silane of formula (1) wherein a is 1 is contained in a proportion of 100 to 50 mol %, more preferably 95 to 50 mol %, and the hydrolyzable silane of formula (1) wherein a is 2 is contained in a proportion of 0 to 50 mol %, more preferably 5 to 50 mol %, in all silane.

It is further preferred that the hydrolyzable silane represented by formula (1) wherein a is 1 is contained in a proportion of 95 to 70 mol %, and the hydrolyzable silane represented by formula (1) wherein a is 2 is contained in a proportion of 5 to 30 mol %.

It is preferred that the second coating polysiloxane is a modified polysiloxane obtained by capping a silanol group of a polysiloxane obtained by hydrolyzing a hydrolyzable silane raw material and condensing the resultant hydrolysate.

The modified polysiloxane preferably contains a silanol group in a proportion of 30 mol % or less, further preferably 20 mol % or less, relative to Si atom.

It is preferred that the modified polysiloxane comprises a hydrolysate condensation product of a hydrolyzable silane raw material represented by formula (1):

[Chemical formula 7]

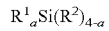    Formula (1)

wherein $R^1$ is bonded to the silicon atom through a Si—C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, and $R^2$ represents an alkoxy group, an acyloxy group, or a halogen group, wherein the hydrolyzable silane wherein a is 0 is contained in an amount of 0 to 100 mol %, more preferably 1 to 100 mol %, and the hydrolyzable silane wherein a is 1 is contained in an amount of 0 to 100 mol %, more preferably 0 to 99 mol %.

In the present invention, there can be used a modified polysiloxane obtained by reacting a silanol group of a polysiloxane with an alcohol so as to control the amount of the silanol group. The modified polysiloxane has a silanol group capped with an alcohol, and a monohydric alcohol may be used as the alcohol. The alcohol is an alcohol having 3 to 10 carbon atoms, and a branched chain alcohol may be more preferably used than a linear chain alcohol.

For example, 4-methyl-2-pentanol, 1-methoxy-2-propanol, or 2-propanol may be used.

A polysiloxane is contacted with an alcohol that will serve as a capping agent and they are reacted at a temperature of 110 to 160° C., for example, at 150° C., for 0.1 to 48 hours, for example, for 24 hours to obtain a modified polysiloxane having a silanol group capped. The alcohol used as a capping agent can be used as a solvent in the composition to be applied to the resist pattern.

The above-mentioned polysiloxane (hydrolysate condensation product) may be used in the form of a mixture of the polysiloxane and a hydrolyzable silane or a hydrolysate thereof. There may be also used a mixture of a silane compound or the hydrolysate condensation product having mixed thereinto a partial hydrolysate, which has not been completely hydrolyzed when obtaining the hydrolysate condensation product. The condensation product is a polymer having a polysiloxane structure.

There may be used a modified polysiloxane synthesized by hydrolyzing and condensing a hydrolyzable silane to obtain a polysiloxane, and dehydrating the polysiloxane using an alcohol and an acid, while removing the formed water from the reaction system.

With respect to the above-mentioned acid, an organic acid having an acid dissociation constant (pka) of −1 to 5, preferably 4 to 5 may be used. Examples of the acids include trifluoroacetic acid, maleic acid, benzoic acid, isobutyric acid, and acetic acid, especially include benzoic acid, isobutyric acid, and acetic acid.

Further, acids having a boiling point of 70 to 160° C. are preferred. Examples of such acids include trifluoroacetic acid, isobutyric acid, and acetic acid.

With respect to the above-mentioned acid, preferred is an acid having an acid dissociation constant (pka) of 4 to 5 or having a boiling point of 70 to 160° C. That is, an acid having weak acidity, or an acid having strong acidity and having a low boiling point may be used.

Any one of the properties of acid dissociation constant and boiling point of an acid can be utilized, but acetic acid having the both properties can be preferably used.

As an unmodified polysiloxane, which is a raw material used in the present invention, there may be used a hydrolysate condensation product obtained by hydrolyzing at least one hydrolyzable silane selected from the group consisting of formula (1) and condensing the resultant hydrolysate.

With respect to the second coating polysiloxane and second coating polysiloxane composition, the technical matters other than those mentioned above are the same as those described in the item "2. First coating polysiloxane composition containing a first coating polysiloxane".

4. Other Components

Components that may be contained commonly in both the first coating polysiloxane composition and the second coating polysiloxane composition are described below. With respect to the first coating polysiloxane composition and the second coating polysiloxane composition, the terms "first" and "second" are omitted for simplicity, and the compositions are referred to merely as "coating polysiloxane composition".

The coating polysiloxane composition in the present invention may contain a curing catalyst. The curing catalyst acts as a curing catalyst when a coating film containing a polyorganosiloxane comprising a hydrolysate condensation product is heated for curing. With respect to the curing catalyst, an ammonium salt, a phosphine, a phosphonium salt, or a sulfonium salt may be used.

The ammonium salt includes a quaternary ammonium salt having a structure represented by the following formula (D-1):

[Chemical formula 8]

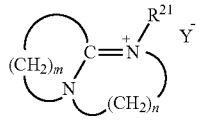

Formula (D-1)

wherein m represents an integer of 2 to 11, n represents an integer of 2 or 3, $R^{21}$ represents an alkyl group or an aryl group, and $Y^-$ represents an anion, a quaternary ammonium salt having a structure represented by the following formula (D-2):

[Chemical formula 9]

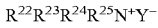

Formula (D-2)

wherein $R^{22}$, $R^{23}$, $R^{24}$, and $R^{25}$ represent an alkyl group or an aryl group, N represents a nitrogen atom, and $Y^-$ represents an anion, wherein each of $R^{22}$, $R^{23}$, $R^{24}$, and $R^{25}$ is bonded to the nitrogen atom through a C—N bonding, a quaternary ammonium salt having a structure represented by the following formula (D-3):

[Chemical formula 10]

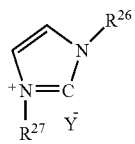

Formula (D-3)

wherein $R^{26}$ and $R^{27}$ represent an alkyl group or an aryl group, and $Y^-$ represents an anion, a quaternary ammonium salt having a structure represented by the following formula (D-4):

[Chemical formula 11]

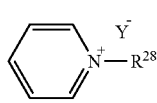

Formula (D-4)

wherein $R^{28}$ represents an alkyl group or an aryl group, and $Y^-$ represents an anion, a quaternary ammonium salt having a structure represented by the following formula (D-5):

[Chemical formula 12]

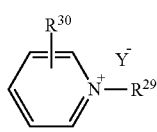

Formula (D-5)

wherein $R^{29}$ and $R^{30}$ represent an alkyl group or an aryl group, and $Y^-$ represents an anion, and a tertiary ammonium salt having a structure represented by the following formula (D-6):

[Chemical formula 13]

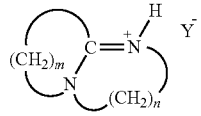

Formula (D-6)

wherein m represents an integer of 2 to 11, n represents an integer of 2 or 3, H represents a hydrogen atom, and $Y^-$ represents an anion.

The phosphonium salt includes a quaternary phosphonium salt represented by the following formula (D-7):

[Chemical formula 14]

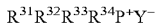

Formula (D-7)

wherein $R^{31}$, $R^{32}$, $R^{33}$, and $R^{34}$ represent an alkyl group or an aryl group, P represents a phosphorus atom, and $Y^-$ represents an anion, wherein each of $R^{31}$, $R^{32}$, $R^{33}$, and $R^{34}$ is bonded to the phosphorus atom through a C—P bonding.

The sulfonium salt includes a tertiary sulfonium salt represented by the following formula (D-8):

[Chemical formula 15]

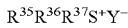

Formula (D-8)

wherein $R^{35}$, $R^{36}$, and $R^{37}$ represent an alkyl group or an aryl group, S represents a sulfur atom, and $Y^-$ represents an anion, wherein each of $R^{35}$, $R^{36}$, and $R^{37}$ is bonded to the sulfur atom through a C—S bonding.

The compound of formula (D-1) above is a quaternary ammonium salt derived from an amine, and m represents an integer of 2 to 11, and n represents an integer of 2 or 3. In the quaternary ammonium salt, $R^{21}$ represents an alkyl group or an aryl group having 1 to 18 carbon atoms, preferably having 2 to 10 carbon atoms, and examples include linear alkyl groups, such as an ethyl group, a propyl group, and a butyl group, and a benzyl group, a cyclohexyl group, a cyclohexylmethyl group, and a dicyclopentadienyl group. Examples of anions ($Y^-$) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—).

The compound of formula (D-2) above is a quaternary ammonium salt represented by $R^{22}R^{23}R^{24}R^{25}N^+Y^-$. In the quaternary ammonium salt, $R^{22}$, $R^{23}$, $R^{24}$, and $R^{25}$ are an alkyl group or an aryl group having 1 to 18 carbon atoms, or a silane compound bonded to a silicon atom through a Si–C bonding. Examples of anions ($Y^-$) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—). This quaternary ammonium salt is commercially available, and examples of such commercially available quaternary ammonium salts include tetramethylammonium acetate, tetrabutylammonium acetate, triethylbenzylammonium chloride, triethylbenzylammonium bromide, trioctylmethylammonium chloride, tributylbenzylammonium chloride, and trimethylbenzylammonium chloride.

The compound of formula (D-3) above is a quaternary ammonium salt derived from a 1-substituted imidazole, and $R^{26}$ and $R^{27}$ are an alkyl group or an aryl group having 1 to 18 carbon atoms, and the total number of carbon atoms of $R^{26}$ and $R^{27}$ is preferably 7 or more. For example, examples of $R^{26}$'s include a methyl group, an ethyl group, a propyl group, a phenyl group, and a benzyl group, and examples of $R^{27}$'s include a benzyl group, an octyl group, and an octadecyl group. Examples of anions ($Y^-$) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—). This compound is commercially available, but can be produced by reacting, for example, an imidazole compound, such as 1-methylimidazole or 1-benzylimidazole, and an alkyl halide or an aryl halide, such as benzyl bromide or methyl bromide.

The compound of formula (D-4) above is a quaternary ammonium salt derived from pyridine, and $R^{28}$ represents an alkyl group or an aryl group having 1 to 18 carbon atoms, preferably having 4 to 18 carbon atoms, and examples include a butyl group, an octyl group, a benzyl group, and a lauryl group. Examples of anions (Y) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—). This compound is commercially available, but can be produced by reacting, for example, pyridine and an alkyl halide or an aryl halide, such as lauryl chloride, benzyl chloride, benzyl bromide, methyl bromide, or octyl bromide. Examples of the compounds include N-laurylpyridinium chloride and N-benzylpyridinium bromide.

The compound of formula (D-5) above is a quaternary ammonium salt derived from a substituted pyridine, such as picoline, and $R^{29}$ is an alkyl group or an aryl group having 1 to 18 carbon atoms, preferably having 4 to 18 carbon atoms, and examples include a methyl group, an octyl group, a lauryl group, and a benzyl group. $R^{30}$ is an alkyl group or an aryl group having 1 to 18 carbon atoms, and, for example, when the compound is a quaternary ammonium derived from picoline, $R^{30}$ is a methyl group. Examples of anions (Y) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—). This compound is commercially available, but can be produced by reacting, for example, a substituted pyridine, such as picoline, and an alkyl halide or an aryl halide, such as methyl bromide, octyl bromide, lauryl chloride, benzyl chloride, or benzyl bromide. Examples of the compounds include N-benzylpicolinium chloride, N-benzylpicolinium bromide, and N-laurylpicolinium chloride.

The compound of formula (D-6) above is a tertiary ammonium salt derived from an amine, and m represents an integer of 2 to 11, and n represents an integer of 2 or 3. Examples of anions (Y) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—). The compound can be produced by reacting an amine and a weak acid, such as a carboxylic acid or phenol. Examples of carboxylic acids include formic acid and acetic acid, and, when formic acid is used, an anion ($Y^-$) is (HCOO—), and, when acetic acid is used, an anion ($Y^-$) is ($CH_3COO$—). When phenol is used, an anion ($Y^-$) is ($C_6H_5O$—).

The compound of formula (D-7) above is a quaternary phosphonium salt having a structure of $R^{31}R^{32}R^{33}R^{34}P^+Y^-$. $R^{31}$, $R^{32}$, $R^{33}$ and $R^{34}$ are an alkyl group or an aryl group having 1 to 18 carbon atoms, or a silane compound bonded to a silicon atom through a Si—C bonding, and it is preferred that three of the four substituents $R^{31}$ to $R^{34}$ are a phenyl group or a substituted phenyl group, for example, a phenyl group or a tolyl group, and the remaining one substituent is an alkyl group having 1 to 18 carbon atoms, an aryl group, or a silane compound bonded to a silicon atom through a Si—C bonding. Examples of anions ($Y^-$) include halogen ions, such as a chloride ion ($Cl^-$), a bromide ion ($Br^-$), and an iodide ion ($I^-$), and acid groups, such as carboxylate (—COO—), sulfonato (—$SO_3$—), and alcoholate (—O—). This compound is commercially available, and examples of such commercially available compounds include tetraalkylphosphonium halides, such as tetra-n-butylphosphonium halides and tetra-n-propylphosphonium halides; trialkylbenzylphosphonium halides, such as triethylbenzylphosphonium halides; triphenylmonoalkylphosphonium halides, such as triphenylmethylphosphonium halides and triphenylethylphosphonium halides; and triphenylbenzylphosphonium halides, tetraphenylphosphonium halides, tritolylmonoarylphosphonium halides, and tritolylmonoalkylphosphonium halides (wherein the halogen atom is a chlorine atom or a bromine atom). Particularly, preferred are triphenylmonoalkylphosphonium halides, such as triphenylmethylphosphonium halides and triphenylethylphosphonium halides; triphenylmonoarylphosphonium halides, such as triphenylbenzylphosphonium halides; tritolylmonoarylphosphonium halides, such as tritolylmonophenylphosphonium halides; and tritolylmonoalkylphosphonium halides, such as tritolylmonomethylphosphonium halides (wherein the halogen atom is a chlorine atom or a bromine atom).

Examples of phosphines include primary phosphines, such as methylphosphine, ethylphosphine, propylphosphine, isopropylphosphine, isobutylphosphine, and phenylphosphine; secondary phosphines, such as dimethylphosphine, diethylphosphine, diisopropylphosphine, diisoamylphosphine, and diphenylphosphine; and tertiary phosphines, such as trimethylphosphine, triethylphosphine, triphenylphosphine, methyldiphenylphosphine, and dimethylphenylphosphine.

The compound of formula (D-8) above is a tertiary sulfonium salt having a structure of $R^{35}R^{36}R^{37}S^+Y^-$. $R^{35}$, $R^{36}$, and $R^{37}$ are an alkyl group or an aryl group having 1 to 18 carbon atoms, or a silane compound bonded to a silicon atom through a Si—C bonding, and it is preferred that three of the four substituents $R^{35}$ to $R^{37}$ are a phenyl group or a substituted phenyl group, for example, a phenyl group or a tolyl group, and the remaining one substituent is an alkyl group having 1 to 18 carbon atoms or an aryl group. Examples of anions (Y) include halogen ions, such as a chloride ion ($Cl^-$), a bromide ion ($Br^-$), and an iodide ion ($I^-$), and acid groups, such as carboxylate (—COO—), sulfonato (—$SO_3$—), alcoholate (—O—), a maleic acid anion, and a nitric acid anion. This compound is commercially available, and examples of such commercially available compounds include tetraalkylsulfonium halides, such as tri-n-butylsulfonium halides and tri-n-propylsulfonium halides; trialkylbenzylsulfonium halides, such as diethylbenzylsulfonium halides; diphenylmonoalkylsulfonium halides, such as diphenylmethylsulfonium halides and diphenylethylsulfonium halides; triphenylsulfonium halides (wherein the halogen atom is a chlorine atom or a bromine atom); tetraalkylphosphonium carboxylates, such as tri-n-butylsulfonium carboxylates and tri-n-propylsulfonium carboxylates; trialkylbenzylsulfonium carboxylates, such as diethylbenzylsulfonium carboxylates; diphenylmonoalkylsulfonium carboxylates, such as diphenylmethylsulfonium carboxylates and diphenylethylsulfonium carboxylates; and triphenylsulfonium carboxylates. Triphenylsulfonium halides and triphenylsulfonium carboxylates can be preferably used.

Further, in the present invention, a nitrogen-containing silane compound may be added as a curing catalyst. Examples of nitrogen-containing silane compounds include imidazole ring-containing silane compounds, such as N-(3-triethoxysilylpropyl)-4,5-dihydroimidazole. The amount of the curing catalyst ranges 0.01 to 10 parts by mass, or 0.01 to 5 parts by mass, or 0.01 to 3 parts by mass, relative to 100 parts by mass of the polyorganosiloxane.

With respect to the curing catalyst, the nitrogen-containing silane compound is especially preferred.

The hydrolyzable silane is hydrolyzed in a solvent using a catalyst and condensed, and, from the obtained hydrolysate condensation product (polymer), an alcohol which is a by-product and the hydrolysis catalyst used and water can be removed at the same time by, for example, vacuum distillation. Further, the acid or basic catalyst used in the hydrolysis can be removed by neutralization or ion-exchange. In the coating polysiloxane composition in the present invention, for stabilizing the coating polysiloxane composition containing the hydrolysate condensation product, an organic acid, water, an alcohol, or a combination thereof may be added.

Examples of the organic acids include oxalic acid, malonic acid, methylmalonic acid, succinic acid, maleic acid, malic acid, tartaric acid, phthalic acid, citric acid, glutaric acid, citric acid, lactic acid, and salicylic acid. Of these, for example, oxalic acid and maleic acid are preferred. The amount of the organic acid added ranges 0.1 to 5.0 parts by mass, relative to 100 parts by mass of the condensation product (polyorganosiloxane). With respect to the water to be added, for example, pure water, ultrapure water, or ion-exchanged water may be used, and the amount of the water added may range 1 to 20 parts by mass, relative to 100 parts by mass of the coating polysiloxane composition. The alcohol to be added is preferably one which is likely to be evaporated by heating after being applied, and examples include methanol, ethanol, propanol, isopropanol, and butanol. The amount of the alcohol added may range 1 to 20 parts by mass, relative to 100 parts by mass of the composition for forming a resist underlayer film.

Accordingly, the coating polysiloxane composition may contain at least one member selected from the group consisting of water, an acid, and a curing catalyst. In addition to the above-mentioned components, the coating polysiloxane composition in the present invention may contain, if necessary, for example, an organic polymer compound, a photo-acid generator, and a surfactant.

By using an organic polymer compound, it is possible to control, for example, the dry etching rate (reduction of the film thickness per unit time), attenuation coefficient and refractive index of the resist underlayer film formed from the coating polysiloxane composition in the present invention.

Examples of photo-acid generators contained in the coating polysiloxane composition in the present invention include onium salt compounds, sulfonimide compounds, and disulfonyldiazomethane compounds. Examples of onium salt compounds include iodonium salt compounds, such as diphenyliodonium hexafluorophosphate, diphenyliodonium trifluoromethanesulfonate, diphenyliodonium nonafluoronormalbutanesulfonate, diphenyliodonium perfluoronormaloctanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoronormalbutanesulfonate, triphenylsulfonium camphorsulfonate, and triphenylsulfonium trifluoromethanesulfonate.

Examples of sulfonimide compounds include N-(trifluoromethanesulfonyloxy)succinimide, N-(nonafluoronormalbutanesulfonyloxy)succinimide, N-(camphorsulfonyloxy)succinimide, and N-(trifluoromethanesulfonyloxy)naphthalimide.

Examples of disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo-acid generators can be used alone or in combination. When a photo-acid generator is used, the amount of the photo-acid generator ranges 0.01 to 15 parts by mass, or 0.1 to 10 parts by mass, or 0.5 to 1 part by mass, relative to 100 parts by mass of the condensation product (polyorganosiloxane).

When applying the coating polysiloxane composition in the present invention to a substrate, a surfactant is effective in suppressing, for example, the occurrence of pinholes and striation. Examples of surfactants contained in the coating polysiloxane composition in the present invention include nonionic surfactants, for example, polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene/polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorine surfactants, such as trade name: EFTOP EF301, EF303, EF352 (manufactured by Tohchem Products Co., Ltd.), trade name: MEGAFACE F171, F173, R-08, R-30, R-30N, R-40LM (manufactured by DIC Corporation), Fluorad FC430, FC431 (manufactured by Sumitomo 3M), and trade name: Asahi-Guard AG710, Surflon S-382, SC101, SC102, SC103, SC104, SC105, SC106 (manufactured by Asahi Glass Co., Ltd.), and organosiloxane polymer KP341 (manufactured by Shin-Etsu Chemical Co., Ltd.). These surfactants can be used alone or in combination. When a surfactant is used, the amount of the surfactant ranges 0.0001 to 5 parts by mass, or 0.001 to 1 part by mass, or 0.01 to 1 part by mass, relative to 100 parts by mass of the condensation product (polyorganosiloxane).

Further, in the coating polysiloxane composition in the present invention, for example, a rheology modifier and a bonding assistant may be added. A rheology modifier is effective in improving the fluidity of the composition for forming a lower layer film. A bonding assistant is effective in improving the adhesion of the lower layer film to the semiconductor substrate or resist.

With respect to the solvent used in the coating polysiloxane composition in the present invention, there is no particular limitation and any solvent can be used as long as it is a solvent capable of dissolving the above-mentioned solids. Examples of such solvents include methyl cellosolve acetate, ethyl cellosolve acetate, propylene glycol, propylene glycol monomethyl ether, propylene glycol monoethyl ether, methylisobutylcarbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents can be used alone or in combination.

EXAMPLES

Hereinbelow, the present invention will be described in detail with reference to the following Examples, which should not be construed as limiting the scope of the present invention.

Synthesis Example A1

22.2 g (30 mol %) of tetraethoxysilane, 44.4 g (70 mol %) of methyltriethoxysilane, and 100 g of acetone were placed in a 500 ml flask, and, while stirring the resultant mixture in the flask by means of a magnetic stirrer, 21.2 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 4-methyl-2-pentanol was added to the reaction solution, and acetone, water, and hydrochloric acid as well as ethanol, which is a by-product of the reaction, were distilled off from the reaction solution under a reduced pressure to concentrate the solution, to obtain a methylisobutylcarbinol solution of a cohydrolysate condensation product (polymer). The solids content of the obtained solution was adjusted to 13% by mass in terms of the solid residue content at 140° C.

20 mg of acetic acid was added to 15 g of the prepared polymer solution. The flask was transferred into an oil bath adjusted to 150° C., and a reaction was conducted for 48 hours while heating under reflux. The polymer had a weight average molecular weight Mw of 5,300 as measured by GPC in which polystyrene was used for molecular weight calibration. The obtained polysiloxane was a polysiloxane having part of the silanol group capped with 4-methyl-2-pentanol.

Synthesis Example A2

30.0 g (80 mol %) of vinyltrimethoxysilane, 7.5 g (20 mol %) of dimethyldiethoxysilane, and 56 g of propylene glycol monomethyl ether acetate were placed in a 300 ml flask, and, while stirring the resultant mixture in the flask by means of a magnetic stirrer, 16.4 g of 0.01 mol/L acetic acid was dropwise added to the mixture. After the dropwise addition, the flask was transferred into an oil bath adjusted to 95° C., and a reaction was conducted for 24 hours. Then, the resultant reaction solution was cooled to room temperature, and 19 g of propylene glycol monomethyl ether acetate was added to the reaction solution, and acetone, water, and acetic acid as well as ethanol, which is a by-product of the reaction, were distilled off from the reaction solution under a reduced pressure to concentrate the solution, to obtain a propylene glycol monomethyl ether acetate solution of a cohydrolysate condensation product (polymer). The solids content of the obtained solution was adjusted to 30% by mass in terms of the solid residue content at 140° C.

15 g of the prepared polymer solution was transferred to a 100 ml flask, and subjected to reaction in an oil bath adjusted to 100° C. for 12 hours. The polymer had a weight average molecular weight Mw of 10,000 as measured by GPC in which polystyrene was used for molecular weight calibration.

Synthesis Example A3

17.0 g of a 35% by mass aqueous solution of tetraethylammonium hydroxide, 27.4 g of 2-propanol, and 54.8 g of tetrahydrofuran were placed in a 200 ml eggplant-shaped flask, and, while stirring the resultant mixture in the flask by means of a magnetic stirrer, 9.0 g (30 mol %) of vinyltrimethoxysilane and 25.3 g (70 mol %) of methyltriethoxysilane were dropwise added to the mixture. After the dropwise addition, the flask was transferred into an oil bath adjusted to 85° C., and a reaction was conducted for 4 hours while heating under reflux. Then, the resultant reaction solution was cooled to room temperature and transferred to a 500 ml separatory funnel. 100 g of ethyl acetate, 34 g of 6 N hydrochloric acid, and 68 g of ultrapure water were added to the separatory funnel, and an operation for separation was performed to obtain an ethyl acetate layer. 68 g of ultrapure water was added to the obtained ethyl acetate layer, and washing was performed. An operation for washing was repeated once more, and the resultant ethyl acetate layer was evaporated under a reduced pressure using an evaporator. The solids content of the obtained ethyl acetate solution of the hydrolysate condensation product (polymer) was adjusted to 20% by mass in terms of the solid residue content at 140° C. The polymer had a weight average molecular weight Mw of 4,000 as measured by GPC in which polystyrene was used for molecular weight calibration.

Comparative Synthesis Example A1

53.9 g (50 mol %) of tetraethoxysilane, 46.1 g (50 mol %) of methyltriethoxysilane, and 100 g of acetone were placed in a 500 ml flask, and, while stirring the resultant mixture in the flask by means of a magnetic stirrer, 32.6 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 4-methyl-2-pentanol was added to the reaction solution, and acetone, water, and hydrochloric acid as well as ethanol, which is a by-product of the reaction, were distilled off from the reaction solution under a reduced pressure to concentrate the solution, to obtain a 4-methyl-2-pentanol solution of a cohydrolysate condensation product (polymer). The solids content of the obtained solution was adjusted to 13% by mass in terms of the solid residue content at 140° C. The polymer had a weight average molecular weight Mw of 1,400 as measured by GPC in which polystyrene was used for molecular weight calibration.

[Determination of Silanol Amount]

The silanol group ratio in the polymer was determined by $^1$H NMR. The measurement was conducted using JNM-ECA500 (manufactured by JEOL LTD.). The area of a chemical shift (0.0 to 0.6 ppm) of methyl protons of triethoxymethylsilane or dimethyldiethoxysilane was first measured, and, when it was taken as a reference, a silanol group was detected at 5 to 7 ppm as a broad peak. A silanol group ratio (mol %) relative to one Si atom in the polymer was determined by comparing the area at 5 to 7 ppm.

In some of the polymers, a chemical shift assigned to a silane monomer structure other than the silanol group is detected at 5 to 7 ppm, and hence a silanol group in an amount larger than the actual amount may be detected. The ratio of the triethoxymethylsilane or dimethyldiethoxysilane to the other constituent silane monomer incorporated is known, and therefore, from the area of methyl protons of triethoxymethylsilane or dimethyldiethoxysilane, the area of a peak assigned to the constituent silane monomer detected at 5 to 7 ppm can be estimated. When a silane monomer having a chemical shift in the same range of chemical shift as that of a silanol group was added, a net silanol amount was determined by subtracting the area of the constituent silane monomer therefrom as mentioned above.

With respect to the polymers in the Synthesis Examples and a commercially available polysilsesquioxane resin (product name: SR-13H (manufactured by Konishi Checimal Ind. Co., Ltd.; Example A4)), silanol amounts determined by the above-mentioned method are shown below.

TABLE 1

| Synthesis Example | Silanol amount relative to one Si atom (mol %) |
| --- | --- |
| Synthesis Example A2 | 13 |
| Synthesis Example A3 | 16 |
| SR-13H | 10 |
| Comparative Synthesis Example A1 | 35 |

[Preparation of Coating Composition]

The polymers obtained above in Synthesis Examples A1 to A3 and Comparative Synthesis Example A1, the above-mentioned SR-13H, an acid, a curing catalyst, a solvent, and ultrapure water were mixed in the respective formulations shown in Table 1 to prepare coating film forming compositions. In Table 1, the amount of the polymer added to the composition is not indicated in terms of the amount of the polymer solution added but in terms of the amount of the polymer. In Table 1, abbreviations are as follows:

maleic acid is MA, N-(3-triethoxysilylpropyl)-4,5-dihydroimidazole is IMIDTEOS, 4-methyl-2-pentanol is MIBC, propylene glycol monomethyl ether acetate is PGMEA, propylene glycol monoethyl ether is PGEE, propylene glycol monomethyl ether is PGME, and ultrapure water is DIW. The amount of each component added is indicated in part(s) by mass.

TABLE 2

Table 1

| | | Preparation Example: A1 | Preparation Example A2 | Preparation Example A3 | Preparation Exampe A4 | Comparative Preparation Example A1 |
| --- | --- | --- | --- | --- | --- | --- |
| Polymer | Type | Synthesis Example A1 | Synthesis Example A2 | Synthesis Example A3 | SR-13H | Comparative Synthesis Example A1 |
| | Part(s) by mass | 3 | 3 | 3 | 3 | 3 |
| Acid | Type | — | MA | MA | MA | MA |
| | Part(s) by mass | — | 0.03 | 0.03 | 0.03 | 0.03 |
| Curing catalyst | Type | — | IMIDTEOS | IMIDTEOS | IMIDTEOS | IMIDTEOS |
| | Part(s) by mass | — | 0.02 | 0.02 | 0.02 | 0.02 |
| Solvent | Type | PGME | PGME | PGME | MIBC | PGME |
| | Part(s) by mass | 5 | 5 | 5 | 100 | 5 |
| | Type | PGEE | PGEE | PGEE | — | PGEE |
| | Part(s) by mass | 63 | 63 | 63 | — | 63 |
| | Type | PGMEA | PGMEA | PGMEA | — | PGMEA |
| | Part(s) by mass | 20 | 20 | 20 | — | 20 |
| | Type | DIW | DIW | DIW | — | DIW |
| | Part(s) by mass | 12 | 12 | 12 | — | 12 |

The results of the evaluation using the coating composition in the present invention are shown below.

[Planarization Property of Coating Composition (Evaluation of the Planarization Property on Si Substrate)]

With respect to each of the coating polysiloxane compositions in Examples A1 to A4 and Comparative Example A1, the planarization property was evaluated as described below. The results of the evaluation are shown in Table 2.

The coating polysiloxane compositions in Examples A1 to A4 and Comparative Example A1 were individually applied onto a stepped substrate having a trench depth of 220 nm and a width of 800 nm using a spin coater under conditions at a rotational speed of 1,500 rpm for 60 seconds, and then dried on a hot plate at 110° C. for one minute to form a polysiloxane coating film. The polysiloxane coating film had a thickness of 90 nm. Then, with respect to the obtained polysiloxane coating film, the form of the cross-section was observed by a SEM cross-section to evaluate the planarization property. The trench pattern having a depth of 220 nm and a width of 800 nm was examined. With respect to the thickness of the film from the bottom of the trench as a reference point (that is, the length from the interface of the silicon substrate on the side in contact with the film to the interface of the polysiloxane coating film on the side in contact with the air), the smallest thickness and the largest thickness were measured, and a difference between the thicknesses was calculated. In the evaluation, a smaller thickness difference indicates better planarization property. The SEM photomicrographs used in the evaluation are shown in FIGS. 1 to 5.

TABLE 2

Figure 1:
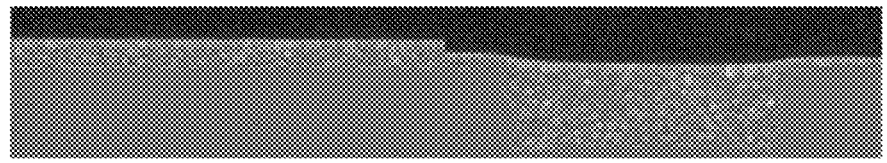
FIG. 1 A SEM photomicrograph used for evaluating the planarization property by observing the form of the cross-section with respect to the polysiloxane coating film obtained in Example A1.
Figure 2:
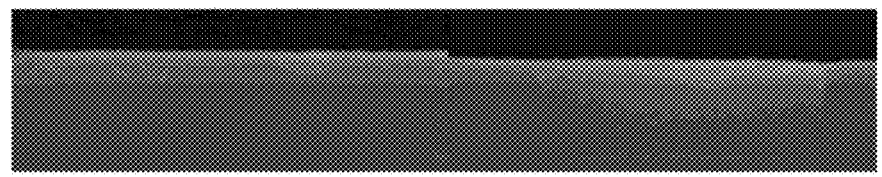
FIG. 2 A SEM photomicrograph used for evaluating the planarization property by observing the form of the cross-section with respect to the polysiloxane coating film obtained in Example A2.
Figure 3:
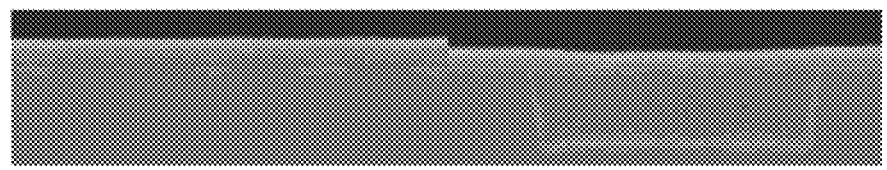
FIG. 3 A SEM photomicrograph used for evaluating the planarization property by observing the form of the cross-section with respect to the polysiloxane coating film obtained in Example A3.
Figure 4:
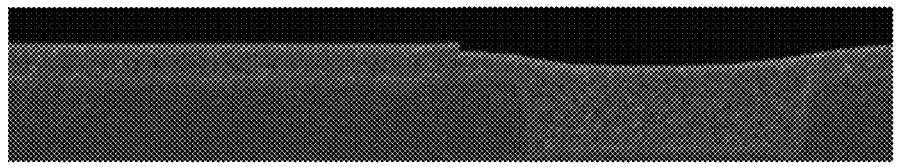
FIG. 4 A SEM photomicrograph used for evaluating the planarization property by observing the form of the cross-section with respect to the polysiloxane coating film obtained in Example A4.
Figure 5:
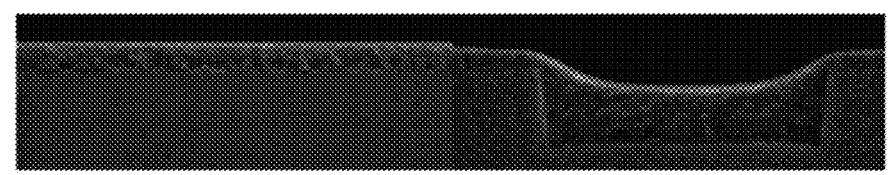
FIG. 5 A SEM photomicrograph used for evaluating the planarization property by observing the form of the cross-section with respect to the polysiloxane coating film obtained in Comparative Example A1.

| Example | Coating composition | Thickness difference (nm) | SEM Photomicrograph |
| --- | --- | --- | --- |
| Example A1 | Preparation Example A1 | 54 | FIG. 1 |
| Example A2 | Preparation Example A2 | 24 | FIG. 2 |
| Example A3 | Preparation Example A3 | 32 | FIG. 3 |
| Example A4 | Preparation Example A4 | 50 | FIG. 4 |
| Comparative Example A1 | Comparative Preparation Example A1 | 104 | FIG. 5 |

[Evaluation of the Planarization Property on Si Substrate in Double Application Process]

With respect to each of the coating polysiloxane compositions in Examples A1 to A3 and Comparative Example A1, the coating composition was applied by a double application process and the planarization property was evaluated as described below. The results of the evaluation are shown in Table 3.

The coating polysiloxane composition in Comparative Example A1 was applied onto a stepped substrate having a trench depth of 220 nm and a width of 800 nm using a spin coater under conditions at a rotational speed of 1,500 rpm for 60 seconds, and then dried on a hot plate at 160° C. for one minute to form a first polysiloxane coating film. The first polysiloxane coating film had a thickness of 90 nm. Then, each of the coating polysiloxane compositions in Examples A1 to A3 was applied onto the obtained first polysiloxane coating film, and then dried on a hot plate at 110° C. for one minute to form a stacked film formed from two layers of the first polysiloxane coating film in Comparative Example A1 and the second polysiloxane coating film in any of Examples A1 to A3. The second polysiloxane coating film had a thickness of 90 nm, and the thickness of the stacked film was 180 nm, which is the total of the thickness (90 nm) of the previously applied first polysiloxane coating film in Comparative Example A1 and the thickness of the second polysiloxane coating film. With respect to the stacked film formed, the form of the cross-section was observed by a SEM cross-section to evaluate the planarization property. The trench pattern having a depth of 220 nm and a width of 800 nm was examined. With respect to the thickness of the film from the bottom of the trench as a reference point (that is, the length from the interface of the silicon substrate on the side in contact with the film to the interface of the second polysiloxane coating film on the side in contact with the air), the smallest thickness and the largest thickness were measured, and a difference between the thicknesses was calculated. In the evaluation, a smaller thickness difference indicates better planarization property. The SEM photomicrographs used in the evaluation are shown in FIGS. 6 to 8.

TABLE 3

Figure 6:
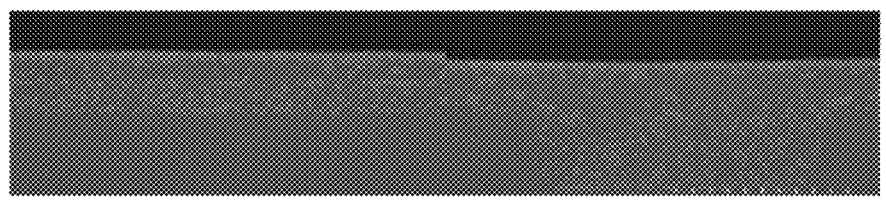
FIG. 6 A SEM photomicrograph used for evaluating the planarization property by observing the form of the cross-section with respect to the polysiloxane coating film obtained in Example A5.
Figure 7:
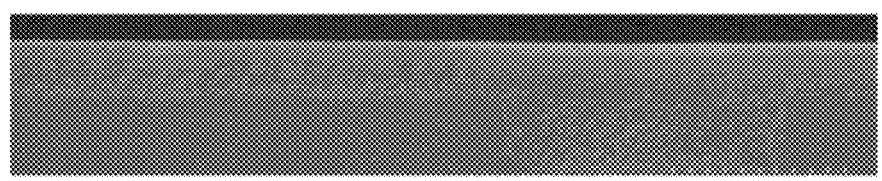
FIG. 7 A SEM photomicrograph used for evaluating the planarization property by observing the form of the cross-section with respect to the polysiloxane coating film obtained in Example A6.
Figure 8:
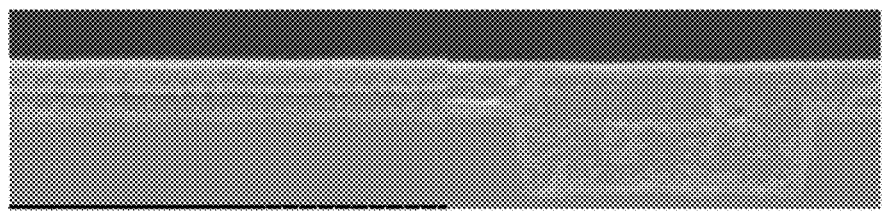
FIG. 8 A SEM photomicrograph used for evaluating the planarization property by observing the form of the cross-section with respect to the polysiloxane coating film obtained in Example A7.

| Example | Coating composition | Thickness difference (nm) | SEM Photomicrograph |
| --- | --- | --- | --- |
| Example A5 | Comparative Preparation Example A1 and Preparation Example A1 | 26 | FIG. 6 |
| Example A6 | Comparative Preparation Example A1 and Preparation Example A2 | 0 | FIG. 7 |
| Example A7 | Comparative Preparation Example A1 and Preparation Example A3 | 8 | FIG. 8 |

[Evaluation of the Planarization Property on Nanoimprinted Substrate]

Next, the planarization property on a substrate patterned by nanoimprinting was evaluated.

[Preparation of Photocuring Resist for Nanoimprinting]

As a resist for nanoimprinting, a general acrylic resist for photonanoimprinting was used. The resist was spin-coated on a quartz substrate, and prebaked for one minute using a hot plate at 100° C. to obtain a film for photonanoimprinting.

[Photonanoimprinting]

As a nanoimprinting apparatus, NM-0801HB (manufactured by Meisyo Kiko Co., Ltd.) was used.

The mold used was made of silicon, and the pattern size was 500 nm. There was used the mold which had been preliminarily immersed in OPTOOL (registered trademark) HD (manufactured by Daikin Industries, Ltd.) and treated using a high-temperature high-humidity apparatus at a temperature of 90° C. at a humidity of 90 RH % for 2 hours, and rinsed with pure water and then air-dried.

The substrate, in the state of having the coating film for photonanoimprinting bonded to the silicon mold, was set in the photonanoimprinting apparatus. Photonanoimprinting was performed under conditions such that the temperature was 23° C. all the time according to the sequence of a) increasing the pressure to 1,000 N over 10 seconds, b) subjecting the substrate and mold to exposure at 500 mJ/cm$^2$ using a high-pressure mercury lamp, c) reducing the pressure over 10 seconds, and d) releasing the mold from the substrate.

[Evaluation of the Planarization Property on Nanoimprinted Substrate]

With respect to each of the coating polysiloxane compositions in Examples A1, A5, and A6 and Comparative Example A1, the planarization property was evaluated as described below. The results of the evaluation are shown in Table 4.

Each of the coating polysiloxane compositions in Examples A1 and A2 and Comparative Example A1 was applied onto the above-mentioned nanoimprinted substrate using a spin coater under conditions at a rotational speed of 1,500 rpm for 60 seconds, and then dried on a hot plate at 110° C. for one minute to form a polysiloxane coating film. The polysiloxane coating film had a thickness of 120 nm. Then, with respect to the obtained polysiloxane coating film, the form of the cross-section was observed by a SEM cross-section to evaluate the planarization property. With respect to the thickness of the film, that is, the length from the interface of the quartz substrate on the side in contact with the film to the interface of the polysiloxane coating film on the side in contact with the air, the smallest thickness and the largest thickness were measured, and a difference between the thicknesses was calculated. In the evaluation, a smaller thickness difference indicates better planarization property.

TABLE 4

| Example | Coating composition | Thickness difference (nm) | Evaluation |
| --- | --- | --- | --- |
| Example A8 | Preparation Example A1 | 27 | Excellent |
| Example A9 | Comparative Preparation Example A1 and Preparation Example A1 | 18 | Excellent |
| Example A10 | Comparative Preparation Example A1 and Preparation Example A2 | 11 | Excellent |
| Comparative Example A1 | Comparative Preparation Example A1 | 37 | Poor |

Synthesis Example B1

53.9 g (50 mol %) of tetraethoxysilane, 46.1 g (50 mol %) of methyltriethoxysilane, and 100 g of acetone were placed in a 500 ml flask, and, while stirring the resultant mixture in the flask by means of a magnetic stirrer, 32.6 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 4-methyl-2-pentanol was added to the reaction solution, and acetone, water, and hydrochloric acid as well as ethanol, which is a by-product of the reaction, were distilled off from the reaction solution under a reduced pressure to concentrate the solution, to obtain a 4-methyl-2-pentanol solution of a cohydrolysate condensation product (polysiloxane). The solids content of the obtained solution was adjusted to 13% by mass in terms of the solid residue content at 140° C.

20 mg of acetic acid was added to 15 g of the prepared polymer solution. The flask was transferred into an oil bath adjusted to 150° C., and a reaction was conducted for 24 hours while heating under reflux. The polymer had a weight average molecular weight Mw of 3,700 as measured by GPC in which polystyrene was used for molecular weight calibration. The obtained polysiloxane was a polysiloxane having part of the silanol group capped with 4-methyl-2-pentanol.

Synthesis Example B2

22.2 g (30 mol %) of tetraethoxysilane, 44.4 g (70 mol %) of methyltriethoxysilane, and 100 g of acetone were placed in a 500 ml flask, and, while stirring the resultant mixture in the flask by means of a magnetic stirrer, 21.2 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 4-methyl-2-pentanol was added to the reaction solution, and acetone, water, and hydrochloric acid as well as ethanol, which is a by-product of the reaction, were distilled off from the reaction solution under a reduced pressure to concentrate the solution, to obtain a methylisobutylcarbinol solution of a cohydrolysate condensation product (polysiloxane). The solids content of the obtained solution was adjusted to 13% by mass in terms of the solid residue content at 140° C.

20 mg of acetic acid was added to 15 g of the prepared polymer solution. The flask was transferred into an oil bath adjusted to 150° C., and a reaction was conducted for 48 hours while heating under reflux. The polymer had a weight average molecular weight Mw of 5,300 as measured by GPC in which polystyrene was used for molecular weight calibration. The obtained polysiloxane was a polysiloxane having part of the silanol group capped with 4-methyl-2-pentanol.

Synthesis Example B3

22.2 g (30 mol %) of tetraethoxysilane, 44.4 g (70 mol %) of methyltriethoxysilane, and 100 g of acetone were placed in a 500 ml flask, and, while stirring the resultant mixture in the flask by means of a magnetic stirrer, 21.2 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 2-propanol was added to the reaction solution, and acetone, water, and hydrochloric acid as well as ethanol, which is a by-product of the reaction, were distilled off from the reaction solution under a reduced pressure to concentrate the solution, to obtain a 2-propanol solution of a cohydrolysate condensation product (polysiloxane). The solids content of the obtained solution was adjusted to 13% by mass in terms of the solid residue content at 140° C.

20 mg of acetic acid was added to 15 g of the prepared polymer solution. The flask was transferred into an oil bath adjusted to 150° C., and a reaction was conducted for 12 hours while heating under reflux. The polymer had a weight average molecular weight Mw of 6,000 as measured by GPC in which polystyrene was used for molecular weight calibration. The obtained polysiloxane was a polysiloxane having part of the silanol group capped with 2-propanol.

Synthesis Example B4

22.2 g (30 mol %) of tetraethoxysilane, 44.4 g (70 mol %) of methyltriethoxysilane, and 100 g of acetone were placed in a 500 ml flask, and, while stirring the resultant mixture in the flask by means of a magnetic stirrer, 21.2 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 1-methoxy-2-propanol was added to the reaction solution, and acetone, water, and hydrochloric acid as well as ethanol, which is a by-product of the reaction, were distilled off from the reaction solution under a reduced pressure to concentrate the solution, to obtain a 1-methoxy-2-propanol solution of a cohydrolysate condensation product (polysiloxane). The solids content of the obtained solution was adjusted to 13% by mass in terms of the solid residue content at 140° C.

20 mg of acetic acid was added to 15 g of the prepared polymer solution. The flask was transferred into an oil bath adjusted to 150° C., and a reaction was conducted for 12 hours while heating under reflux. The polymer had a weight average molecular weight Mw of 4,000 as measured by GPC in which polystyrene was used for molecular weight calibration. The obtained polysiloxane was a polysiloxane having part of the silanol group capped with 1-methoxy-2-propanol.

Comparative Synthesis Example B1

53.9 g (50 mol %) of tetraethoxysilane, 46.1 g (50 mol %) of methyltriethoxysilane, and 100 g of acetone were placed in a 500 ml flask, and, while stirring the resultant mixture in the flask by means of a magnetic stirrer, 32.6 g of 0.01 mol/L hydrochloric acid was dropwise added to the mixture. After the dropwise addition, the flask was transferred into an oil bath adjusted to 85° C., and a reaction was conducted for 4 hours while heating under reflux. Then, the resultant reaction solution was cooled to room temperature, and 100 g of 4-methyl-2-pentanol was added to the reaction solution, and acetone, water, and hydrochloric acid as well as ethanol, which is a by-product of the reaction, were distilled off from the reaction solution under a reduced pressure to concentrate the solution, to obtain a 4-methyl-2-pentanol solution of a cohydrolysate condensation product (polysiloxane). The solids content of the obtained solution was adjusted to 13% by mass in terms of the solid residue content at 140° C. The polymer had a weight average molecular weight Mw of 1,400 as measured by GPC in which polystyrene was used for molecular weight calibration. The obtained polysiloxane was a polysiloxane having part of the silanol group capped with 4-methyl-2-pentanol.

(Measurement of Capping Ratio)

A silanol group ratio in the polymer and capping ratios with 4-methyl-2-pentanol, 1-methoxy-2-propanol, or 2-propanol were determined by $^1$H NMR. The measurement was conducted using JNM-ECA500 (manufactured by JEOL LTD.). The area of a chemical shift (0.0 to 0.3 ppm) of methyl protons of triethoxymethylsilane was first measured and taken as a reference. A chemical shift of methine protons of 4-methyl-2-pentanol, 1-methoxy-2-propanol and 2-propanol was detected at around 3.8 ppm, but, when the alcohol suffered a dehydration condensation reaction with a silanol group to form a bonding with the silicon atom, that is, a capping reaction with a silanol group occurred, the chemical shift of the methine protons was moved to around 4.2 ppm. The area of the moved chemical shift at around 4.2 ppm of the methine protons was measured, and compared with the previously measured area of the methyl protons of triethoxymethylsilane to determine a capping ratio with 4-methyl-2-pentanol, 1-methoxy-2-propanol, or 2-propanol for one silicon atom in the polymer.

[Preparation of Coating Composition]

Each of the polymer solutions obtained above in Synthesis Examples B1 to B4 and Comparative Synthesis Example B1 was diluted with 1-methoxy-2-propanol, 2-propanol, or 1-methoxy-2-propanol to obtain coating compositions. In Table 5, the amount of the polymer contained in the composition is not indicated in terms of the amount of the polymer solution but in terms of the amount of solids obtained by removing the solvent from the polymer solution. The amount of each component contained is indicated in part(s) by mass. In Table 5, 4-methyl-2-pentanol, 2-propanol, and 1-methoxy-2-propanol are abbreviated to MIBC, IPA, and PGME, respectively.

TABLE 5

| | Polymer | | Solvent | | Silanol group/Capping ratio |
|---|---|---|---|---|---|
| | Type | Amount | Type | Part(s) by mass | (S1 = 1.00) |
| Preparation Example B1 | Synthesis Example B1 | 4 | MIBC | 100 | SiOH/MIBC Capping 0.25/0.27 |
| Preparation Example B2 | Synthesis Example B2 | 4 | MIBC | 100 | SiOH/MIBC Capping 0.24/0.20 |
| Preparation Example B3 | Synthesis Example B3 | 4 | IPA | 100 | SiOH/IPA Capping 0.25/0.19 |
| Preparation Example B4 | Synthesis Example B4 | 4 | PGME | 100 | SiOH/PGME Capping 0.22/0.25 |
| Comparative Preparation Example B1 | Comparative Synthesis Example B1 | 4 | MIBC | 100 | SiOH/MIBC Capping 0.45/0.04 |

The results of the evaluation using the coating composition in the present invention are shown below.

[Planarization Property of Coating Composition (Evaluation of the Planarization Property on Si Substrate)]

With respect to each of the coating polysiloxane compositions in Examples B1 to B4 and Comparative Example B1, the planarization property was evaluated as described below. The results of the evaluation are shown in Table 6.

Each of the coating polysiloxane compositions (coating compositions) in Examples B1 to B4 and Comparative Example B1 was applied onto a stepped substrate having a trench depth of 220 nm and a width of 800 nm using a spin coater under conditions at a rotational speed of 1,500 rpm for 60 seconds, and then dried on a hot plate at 110° C. for one minute to form a polysiloxane coating film. The polysiloxane coating film had a thickness of 120 nm. Then, with respect to the obtained polysiloxane coating film, the form of the cross-section was observed by a SEM cross-section to evaluate the planarization property. The trench pattern having a depth of 220 nm and a width of 800 nm was examined. With respect to the thickness of the film, that is, the length from the interface of the substrate on the side in contact with the film to the interface of the polysiloxane coating film on the side in contact with the air, the smallest thickness and the largest thickness were measured, and a difference between the thicknesses was calculated. In the evaluation, a smaller thickness difference indicates better planarization property. The SEM photomicrographs used in the evaluation are shown in FIGS. 9 to 13.

TABLE 6

Figure 9:
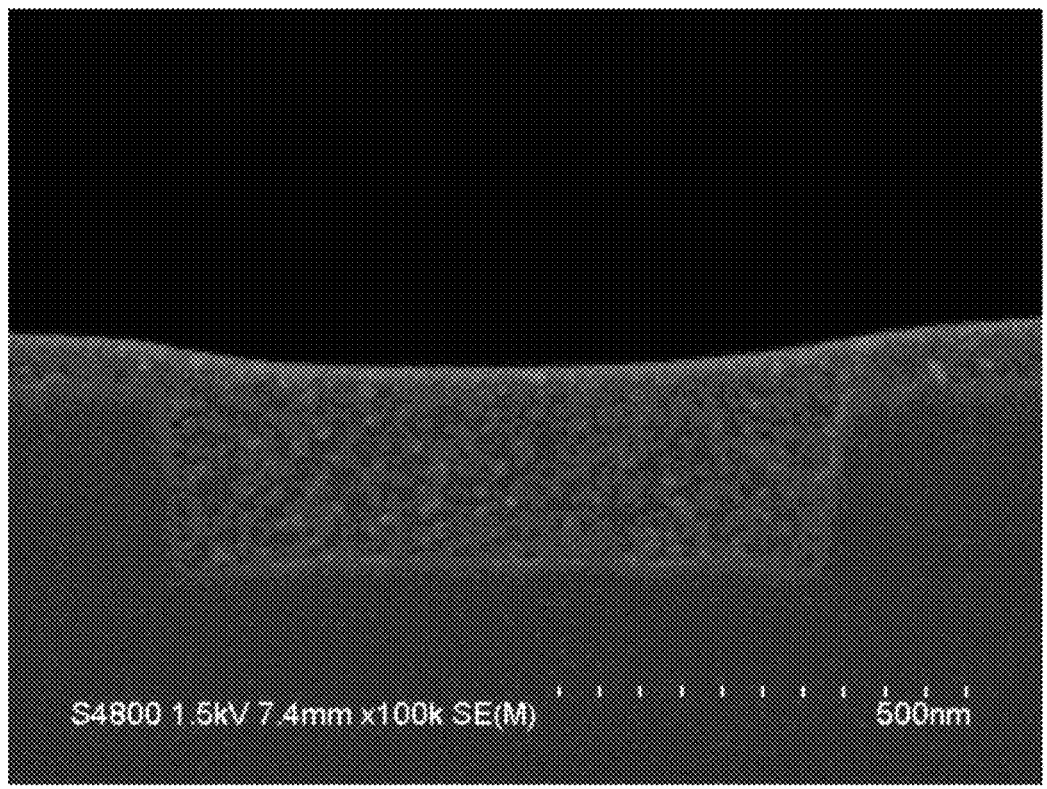
FIG. 9 A cross-sectional view of a film formed from the coating composition in Example B1 on a stepped substrate having a trench depth of 220 nm and a width of 800 nm (magnification: 150,000 times).
Figure 10:
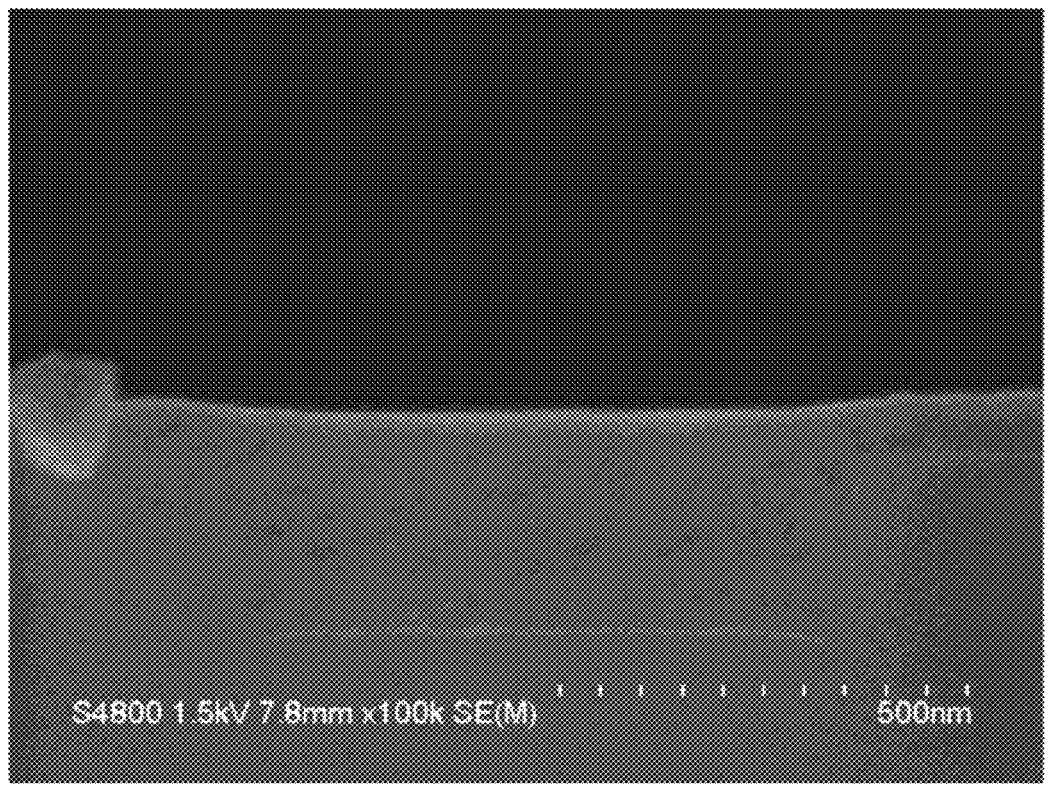
FIG. 10 A cross-sectional view of a film formed from the coating composition in Example B2 on a stepped substrate having a trench depth of 220 nm and a width of 800 nm (magnification: 150,000 times).
Figure 11:
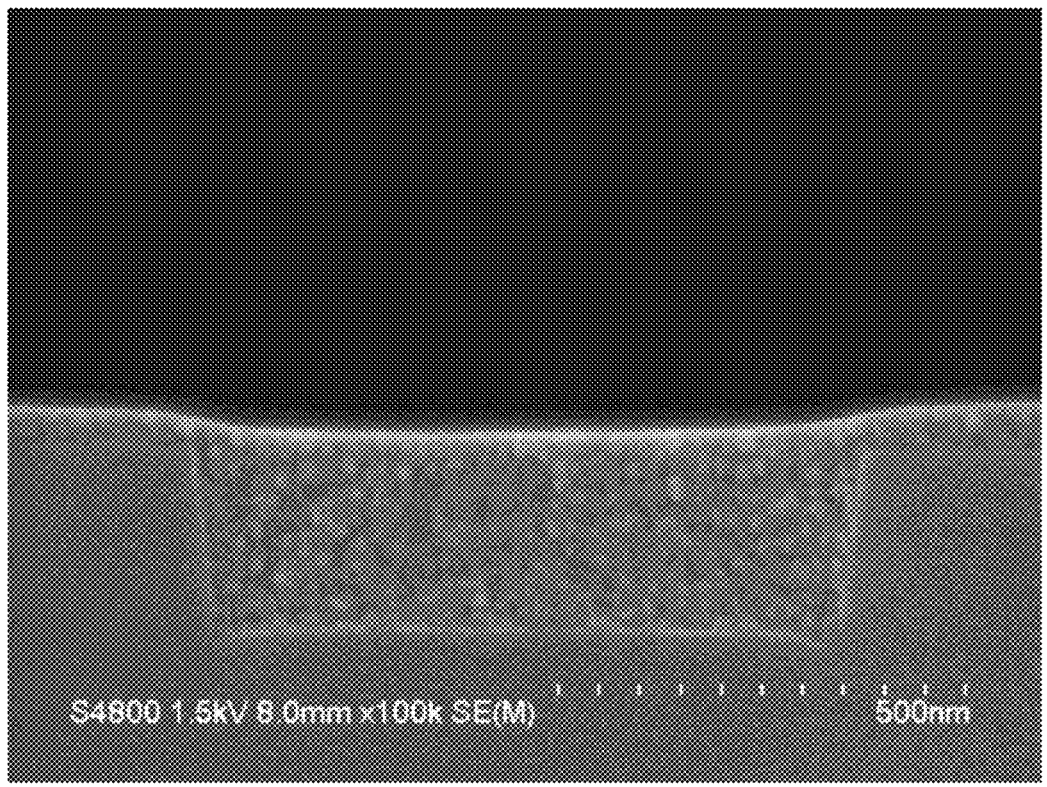
FIG. 11 A cross-sectional view of a film formed from the coating composition in Example B3 on a stepped substrate having a trench depth of 220 nm and a width of 800 nm (magnification: 150,000 times).
Figure 12:
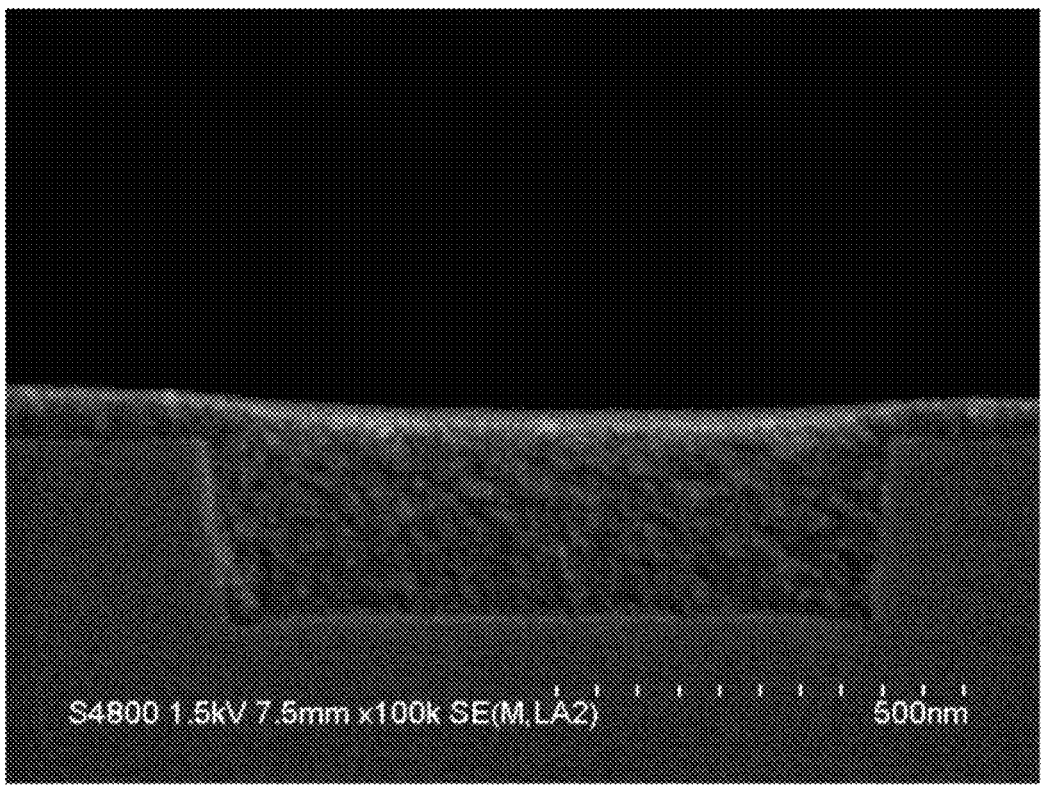
FIG. 12 A cross-sectional view of a film formed from the coating composition in Example B4 on a stepped substrate having a trench depth of 220 nm and a width of 800 nm (magnification: 150,000 times).
Figure 13:
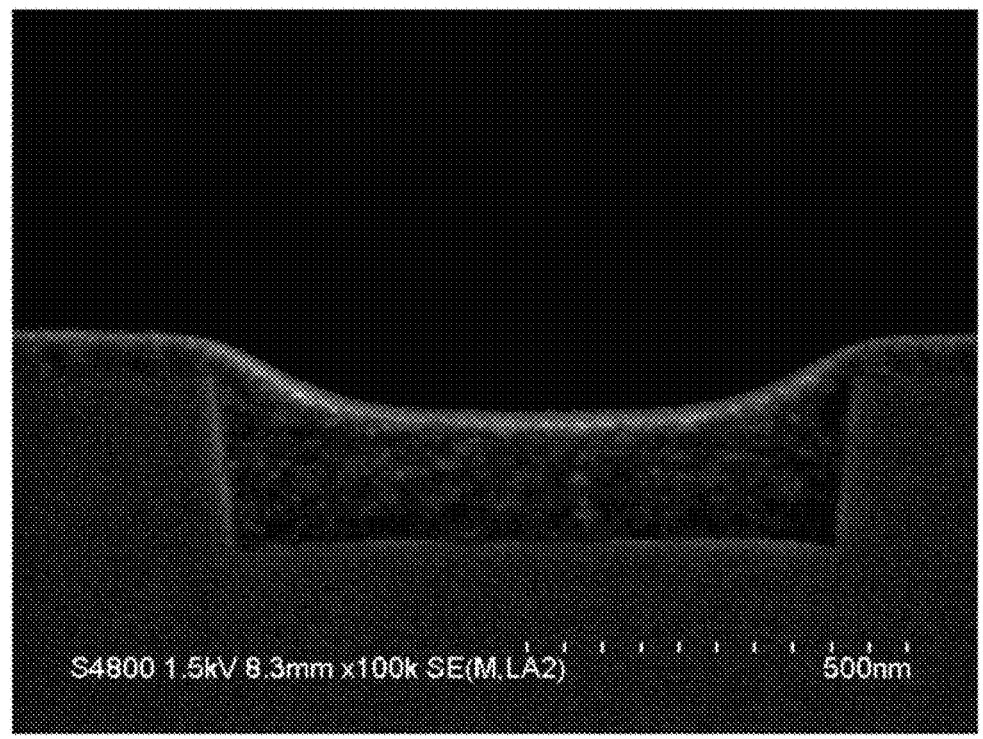
FIG. 13 A cross-sectional view of a film formed from the coating composition in Comparative Example B1 on a stepped substrate having a trench depth of 220 nm and a width of 800 nm (magnification: 150,000 times).

| Example | Coating composition | Thickness difference (nm) | SEM Photomicrograph |
|---|---|---|---|
| Example B1 | Preparation Example B1 | 54 | FIG. 9 |
| Example B2 | Preparation Example B2 | 26 | FIG. 10 |
| Example B3 | Preparation Example B3 | 38 | FIG. 11 |
| Example B4 | Preparation Example B4 | 30 | FIG. 12 |
| Comparative Example B1 | Comparative Preparation Example B1 | 104 | FIG. 13 |

[Evaluation of the Planarization Property on Nanoimprinted Substrate]

Next, the planarization property on a substrate patterned by nanoimprinting was evaluated.

(Preparation of Photocuring Resist for Nanoimprinting)

As a resist for nanoimprinting, a general acrylic resist for photonanoimprinting was used. The resist was spin-coated on a quartz substrate, and prebaked for one minute using a hot plate at 100° C. to obtain a film for photonanoimprinting.

(Photonanoimprinting)

As a nanoimprinting apparatus, NM-0801HB (manufactured by Meisyo Kiko Co., Ltd.) was used.

The mold used was made of silicon, and the pattern size was 500 nm. There was used the mold which had been preliminarily immersed in OPTOOL (registered trademark) HD (manufactured by Daikin Industries, Ltd.) and treated using a high-temperature high-humidity apparatus at a temperature of 90° C. at a humidity of 90 RH % for 2 hours, and rinsed with pure water and then air-dried.

The substrate, in the state of having the coating film for photonanoimprinting bonded to the silicon mold, was set in the photonanoimprinting apparatus. Photonanoimprinting was performed under conditions such that the temperature was 23° C. all the time according to the sequence of a) increasing the pressure to 1,000 N over 10 seconds, b) subjecting the substrate and mold to exposure at 500 mJ/cm² using a high-pressure mercury lamp, c) reducing the pressure over 10 seconds, and d) releasing the mold from the substrate.

(Evaluation of the Planarization Property on Nanoimprinted Substrate)

With respect to each of the coating polysiloxane compositions in Examples B1 to B4 and Comparative Example B 1, the planarization property was evaluated as described below. The results of the evaluation are shown in Table 7.

Each of the coating polysiloxane compositions (coating compositions) in Examples B1 to B4 and Comparative Example B1 was applied onto the above-mentioned nanoimprinted substrate using a spin coater under conditions at a rotational speed of 1,500 rpm for 60 seconds, and then dried on a hot plate at 110° C. for one minute to form a polysiloxane coating film comprising the coating polysiloxane composition (coating composition). The polysiloxane coating film comprising the coating polysiloxane composition had a thickness of 120 nm. Then, with respect to the obtained polysiloxane coating film, the form of the cross-section was observed by a SEM cross-section to evaluate the planarization property. With respect to the thickness of the film, that is, the length from the interface of the substrate on the side in contact with the film to the interface of the polysiloxane coating film on the side in contact with the air, the smallest thickness and the largest thickness were measured, and a difference between the thicknesses was calculated. In the evaluation, a smaller thickness difference indicates better planarization property.

TABLE 7

| Example | Coating composition | Thickness difference (nm) |
|---|---|---|
| Example B1 | Preparation Example B1 | 27 |
| Example B2 | Preparation Example B2 | 23 |
| Example B3 | Preparation Example B3 | 23 |
| Example B4 | Preparation Example B4 | 24 |
| Comparative Example B1 | Comparative Preparation Example B1 | 37 |

In Examples B1 to B4, a flat film having a thickness difference of 30 nm or less, for example, about 5 to 30 nm can be formed.

INDUSTRIAL APPLICABILITY

There can be provided a method for forming a coating film on a stepped substrate formed on a substrate to be processed, which is advantageous in that the formed coating film can not only advantageously fill the pattern in the stepped substrate but also be flat.

REFERENCE SIGNS LIST

1: Semiconductor substrate
2: Organic underlayer film
3: Resist composition
4: First polysiloxane coating film
5: Second polysiloxane coating film
a: Depth of the depression in the polysiloxane coating film at the center of the dense space portion
b: Depth of the depression in the polysiloxane coating film at the center of the open space portion
c: Depth of the original space in the stepped substrate used
d: Polysiloxane coating film
e: Stepped substrate

The invention claimed is:

1. A method for producing a polysiloxane coated substrate comprising the first step of applying a first coating polysiloxane composition comprising a first coating polysiloxane onto a stepped substrate and baking the applied composition to form a first polysiloxane coating film, and the second step of further applying onto the first polysiloxane coating film a second coating polysiloxane composition comprising a second coating polysiloxane different from the first coating polysiloxane and baking the applied composition to form a second polysiloxane coating film, wherein the first coating polysiloxane comprises a first hydrolysate condensation product of a first hydrolyzable silane raw material comprising a first hydrolyzable silane having four hydrolyzable groups per molecule in a proportion of 0 to 100 mol % in all silane, the second coating polysiloxane comprises a second hydrolysate condensation product of a second hydrolyzable silane raw material comprising a second hydrolyzable silane represented by formula (1):

$$R^1_a Si(R^2)_{4-a} \quad \text{Formula (1)}$$

where $R^1$ is bonded to a silicon atom through a Si–C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, $R^2$ represents an alkoxy group, an acyloxy group, or a halogen group, and a represents 1, the second polysiloxane coating film has an iso-dense bias of 50 nm or less, and the second coating polysiloxane comprises a silanol group in a proportion of 30 mol % or less relative to Si atom, and has a weight average molecular weight of 1,000 to 50,000.

2. The method according to claim 1, wherein the first hydrolyzable silane is represented by formula (1), where $R^1$ is bonded to a silicon atom through a Si–C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, $R^2$ represents an alkoxy group, an acyloxy group, or a halogen group, and a represents an integer of 0 to 2, and the first hydrolyzable silane raw material comprises 0 to 50 mol % of the first hydrolyzable silane wherein a is 0, and 50 (exclusive) to 100 mol % of the first hydrolyzable silane wherein a is 1 or 2.

3. The method according to claim 1, wherein the second hydrolyzable silane raw material comprises 100 to 50 mol % of the second hydrolyzable silane wherein a is 1, and 0 to 50 mol % of the second hydrolyzable silane wherein a is 2.

4. The method according to claim 1, wherein the second coating polysiloxane is a modified polysiloxane having a capped silanol group of a polysiloxane which is a hydrolyzed and condensed product of the second hydrolyzable silane raw material, the modified polysiloxane comprising the silanol group in the proportion of 30 mol % or less relative to Si atom, wherein the modified polysiloxane comprises the second hydrolysate condensation product of the second hydrolyzable silane raw material, and the second hydrolyzable silane raw material comprises 0 to 100 mol % of the second hydrolyzable silane.

5. The method according to claim 1, wherein the second coating polysiloxane film is not photosensitive.

6. A method for producing a semiconductor device, the method comprising:

a first step of applying a first coating polysiloxane composition comprising a first coating polysiloxane onto an organic pattern substrate and baking the applied composition to form a first polysiloxane coating film, a second step of further applying onto the first polysiloxane coating film a second coating polysiloxane composition comprising a second coating polysiloxane different from the first coating polysiloxane and baking the applied composition to form a second polysiloxane coating film, etching back a polysiloxane coated substrate produced by the first and second steps so that the organic pattern is exposed, and removing the organic pattern by etching so that a reverse pattern remains, wherein the second coating polysiloxane comprises a hydrolysate condensation product of a hydrolyzable silane raw material comprising a hydrolyzable silane represented by formula (1):

$$R^1{}_a Si(R^2)_{4-a} \qquad \text{Formula (1)}$$

where $R^1$ is bonded to a silicon atom through a Si–C bonding and represents an alkyl group, an aryl group, a haloalkyl group, a haloaryl group, an alkoxyaryl group, an alkenyl group, or an organic group having an epoxy group, an acryloyl group, a methacryloyl group, a mercapto group, or a cyano group, $R^2$ represents an alkoxy group, an acyloxy group, or a halogen group, and a represents 1.

7. The method according to claim 6, wherein the second coating polysiloxane film is not photosensitive.

* * * * *